United States Patent
Torai et al.

(10) Patent No.: US 10,353,009 B2
(45) Date of Patent: Jul. 16, 2019

(54) SECONDARY BATTERY CAPACITY MEASURING SYSTEM AND SECONDARY BATTERY CAPACITY MEASURING METHOD

(71) Applicant: YOKOGAWA ELECTRIC CORPORATION, Musashino-shi, Tokyo (JP)

(72) Inventors: Soichiro Torai, Tokyo (JP); Satoshi Yoshitake, Tokyo (JP); Masahiro Kazumi, Tokyo (JP); Masaru Nakagomi, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 140 days.

(21) Appl. No.: 15/404,275

(22) Filed: Jan. 12, 2017

(65) Prior Publication Data

US 2017/0212170 A1 Jul. 27, 2017

(30) Foreign Application Priority Data

Jan. 21, 2016 (JP) .................... 2016-009902

(51) Int. Cl.
*H01M 10/42* (2006.01)
*H01M 10/48* (2006.01)
*G01R 31/367* (2019.01)
*G01R 31/392* (2019.01)
*G01R 31/396* (2019.01)

(52) U.S. Cl.
CPC ......... *G01R 31/367* (2019.01); *G01R 31/392* (2019.01); *G01R 31/396* (2019.01); *H01M 10/4285* (2013.01); *H01M 10/482* (2013.01)

(58) Field of Classification Search
CPC .................................................. G01R 31/3651
See application file for complete search history.

(56) References Cited

U.S. PATENT DOCUMENTS

2011/0012604 A1 1/2011 Tsujiko et al.
2011/0161025 A1* 6/2011 Tomura .............. G01R 31/3651
702/63

(Continued)

FOREIGN PATENT DOCUMENTS

EP 2 053 414 A2 4/2009
JP 2009-80093 A 4/2009

(Continued)

OTHER PUBLICATIONS

Caihao Weng et al., "A unified open-circuit-voltage model of lithium-ion batteries for state-of-charge estimation and state-of-health monitoring", Journal of Power Sources, 2014, pp. 228-237, vol. 258.

(Continued)

*Primary Examiner* — Manuel L Barbee
*Assistant Examiner* — Raymond L Nimox
(74) *Attorney, Agent, or Firm* — Sughrue Mion, PLLC

(57) ABSTRACT

A secondary battery capacity measuring system that estimates maximum capacities of other cells using characteristics of a deteriorated cell even when a charging process in the deteriorated cell having a smaller maximum capacity than the other cells in cells constituting a battery module ends and data for measuring the maximum capacities of the other cells cannot be acquired is provided.

15 Claims, 14 Drawing Sheets

(56) References Cited

U.S. PATENT DOCUMENTS

| | | | | |
|---|---|---|---|---|
| 2013/0314050 A1* | 11/2013 | Matsubara | ............... | H02J 7/00 |
| | | | | 320/134 |
| 2014/0167773 A1* | 6/2014 | Hamano | ............. | G01R 31/362 |
| | | | | 324/426 |
| 2015/0032394 A1* | 1/2015 | Kimura | ............... | H05K 999/99 |
| | | | | 702/63 |
| 2015/0212158 A1* | 7/2015 | Takahashi | ........... | B60L 11/1864 |
| | | | | 324/424 |
| 2016/0254687 A1* | 9/2016 | Tanaka | ................... | H02J 7/045 |
| | | | | 320/112 |
| 2017/0082694 A1* | 3/2017 | Yonemoto | ............. | G01R 31/36 |

FOREIGN PATENT DOCUMENTS

| | | |
|---|---|---|
| JP | 2009-252381 A | 10/2009 |
| JP | 2014-002122 A | 1/2014 |

OTHER PUBLICATIONS

M. Safari et al., "Aging of a Commercial Graphite/LiFeP04 Cell", Journal of the Electrochemical Society, 2011, pp. A1123-A1135, vol. 158, No. 10.

\* cited by examiner

FIG. 3
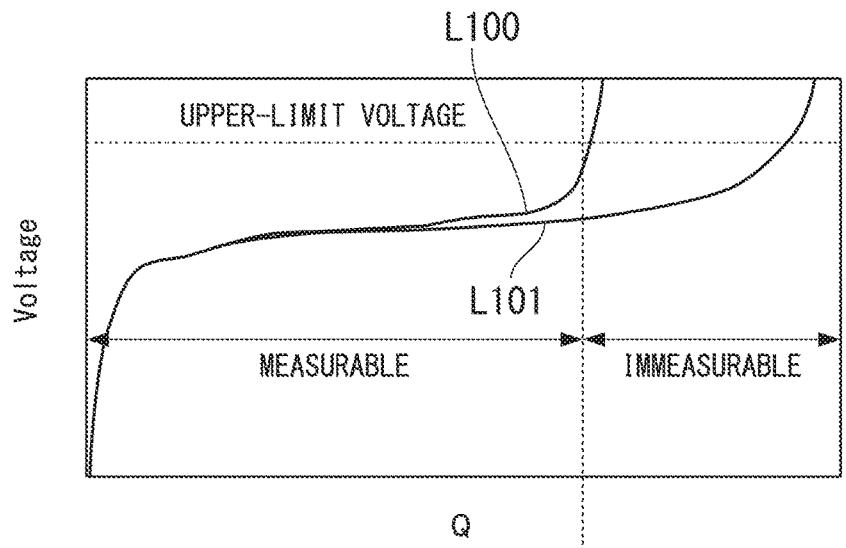
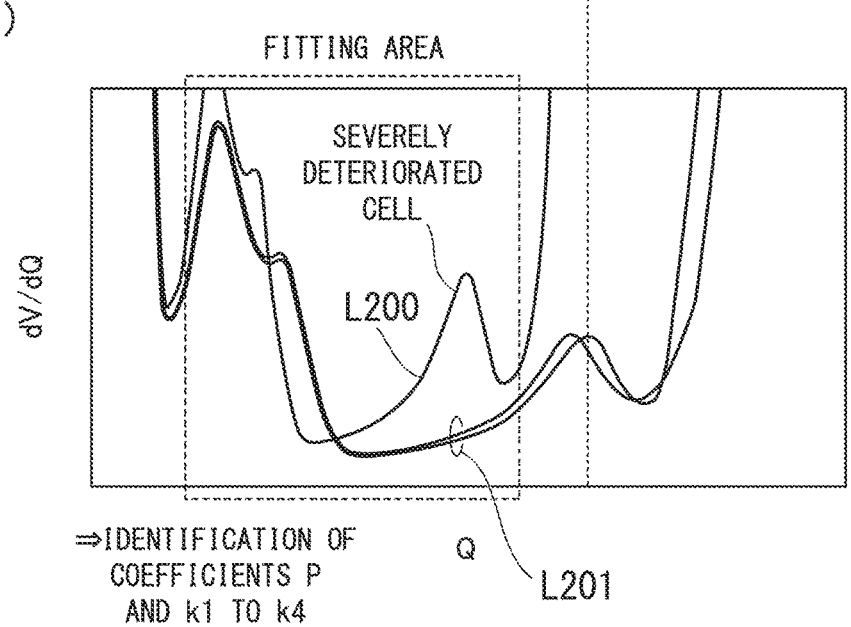

FIG. 8
(a)
$$f(V) = P\{k_1(f(V))_{Peak1} + k_2(f(V))_{Peak2} + k_3(f(V))_{Peak3} + k_4(f(V))_{Peak4}\}$$
$k_1 = 1.25 \quad k_2 = 1.10 \quad k_3 = 0.80 \quad k_4 = 0.75$
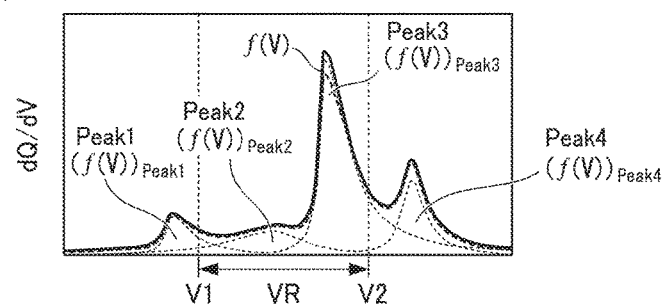
ESTIMATED FULL CHARGING CAPACITY
$Qmax = P \times Qini$
$Q = \int (f(V))dV$
(b) 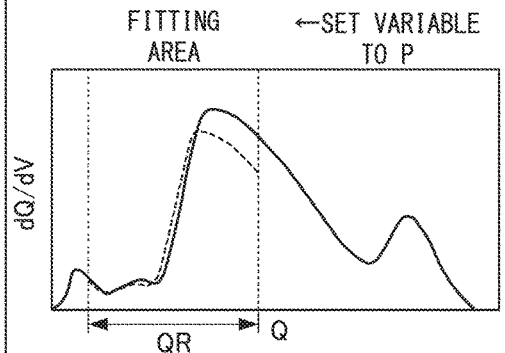
(c) 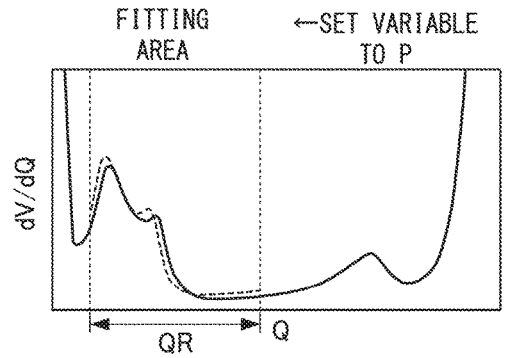

*FIG. 14*

|  |  | COEFFICIENT (PARAMETER) | | | |
| --- | --- | --- | --- | --- | --- |
|  |  | k1 | k2 | k3 | k4 |
| TEMPERATURE | 5°C | ... | ... | ... | ... |
|  | 15°C | ... | ... | ... | ... |
|  | 25°C | 1.25 | 1.10 | 0.80 | 0.75 |
|  | 35°C | ... | ... | ... | ... |
|  | 45°C | ... | ... | ... | ... |

SECONDARY BATTERY CAPACITY MEASURING SYSTEM AND SECONDARY BATTERY CAPACITY MEASURING METHOD

BACKGROUND OF THE INVENTION

Field of the Invention

The present invention relates to a secondary battery capacity measuring system and a secondary battery capacity measuring method for measuring the maximum capacity of a secondary battery.

Priority is claimed on Japanese Patent Application No. 2016-009902, filed Jan. 21, 2016, the content of which is incorporated herein by reference.

Description of Related Art

All patents, patent applications, patent publications, scientific articles, and the like, which will hereinafter be cited or identified in the present application, will hereby be incorporated by reference in their entirety in order to describe more fully the state of the art to which the present invention pertains.

A secondary battery which is rechargeable is used as a power source for a running motor of a hybrid automobile, an electric automobile, or the like, and is also widely used in the industrial field, public institutions, ordinary households, and the like from the viewpoint of accumulating energy with a relatively small environmental load such as through solar power generation or wind power generation without depending on fossil fuel.

In general, such a secondary battery is configured as a battery module in which a predetermined number of battery cells are connected in series to acquire a desired output voltage, or is configured as a battery pack in which a predetermined number of battery modules providing a desired output voltage are connected in parallel to acquire a desired current capacity (Ah).

A maximum capacity of a battery is used as an index indicating performance of a secondary battery. The maximum capacity can be defined as a current capacity (Ah) which is output until the open-circuit voltage of the battery decreases from the maximum voltage to the available minimum voltage in the available voltage range of the battery.

Whenever the secondary battery is repeatedly charged and discharged, characteristics thereof are deteriorated and the maximum capacity is gradually decreased due to deactivation or side reaction of active materials responsible for electrical conduction. The active materials are materials of a positive electrode and a negative electrode. For example, in a Li (lithium) ion battery, a carbon material is used for the negative electrode and a lithium transition metal oxide is used for the positive electrode.

In the secondary battery, energy of the active materials is biased in areas close to a lower limit and an upper limit of a state of charge (SOC), which is a ratio of a remaining capacity to the maximum capacity of the battery, toward an overcharged or overdischarged state, whereby deterioration thereof rapidly progresses.

Accordingly, in the secondary battery, it is necessary to restrict charging and discharging in areas close to the maximum voltage and the minimum voltage. By operating the secondary battery in a predetermined SOC range, it is possible to suppress deterioration and to extend a life span of the secondary battery in comparison with a case in which overcharging or overdischarging is carried out. Here, the predetermined SOC range is generally in a range of 50%±30%, that is, about 20% to 80%, of the maximum capacity.

In order to manage and operate the secondary battery in the predetermined SOC range, it is important to accurately understand the SOC. The SOC can be acquired by integrating a charging/discharging current at a time of charging or discharging of the battery. However, when the SOC is acquired using the charging/discharging current, an error in analog/digital (A/D) conversion of a current sensor is accumulated over long-term operation of the battery. In order to correct the error, it is necessary to perform an SOC calibrating operation at a certain time. Since the SOC is defined as a ratio of a remaining capacity to the maximum capacity, it is essential to accurately understand the maximum capacity of the secondary battery during deterioration in order to accurately understand the SOC.

The maximum capacity is generally acquired by time integration of a minute current (a minute discharging current) while allowing the secondary battery to completely discharge through the minute current after fully charging the secondary battery.

Accordingly, for example, in a stationary electricity storage system, an SOC temporarily departs from the SOC range in a normal operation mode and an operation mode is switched from the normal operation mode to an evaluation mode in which the maximum capacity is measured for a long time.

Here, as a time associated with the evaluation mode increases, a time in which operation of the secondary battery stops is increased and operational efficiency of the secondary battery is reduced.

Accordingly, when acquisition of the maximum capacity of the secondary battery is intended, it is necessary to estimate the maximum capacity of a deteriorated battery for a short time at a low cost without departing from the SOC range in the normal operation mode.

For this reason, a technique of estimating a maximum capacity of a secondary battery using charging and discharging characteristics in some sections of an estimation subject secondary battery and using a correlation between characteristics in the sections and the maximum capacity when estimating the maximum capacity of the secondary battery is known (for example, see Japanese Unexamined Patent Application, First Publication No. 2014-002122, Japanese Unexamined Patent Application, First Publication No. 2009-252381, and "A unified open-circuit-voltage model of lithium-ion batteries for state-of-charge estimation and state-of-health monitoring", Caihao Weng et. al, journal of Power Sources 258 (2014), p. 228-237). Accordingly, it is possible to shorten the time required for charging and discharging for estimating the maximum capacity of the secondary battery using characteristics in some sections narrower than an SOC range from 0% to 100% which is the whole section.

In Japanese Unexamined Patent Application, First Publication No. 2014-002122, a maximum capacity in discharging is measured using a linear correlation between a capacity value and a maximum capacity when an inter-terminal voltage of power supply terminals of a secondary battery is discharged from a predetermined first voltage to a second voltage.

In Japanese Unexamined Patent Application, First Publication No. 2014-002122, since the linear correlation improves as a range of a discharging area used to estimate the maximum capacity is increased, the estimation accuracy of the maximum capacity is improved and thus discharging is performed in an SOC range corresponding to 10% to 90%.

In Japanese Unexamined Patent Application, First Publication No. 2009-252381, the maximum capacity of a secondary battery is estimated using differential characteristics "dV/dQ vs Q" which are observed in an area in which the voltage is flat in charging/discharging characteristics (an area in which an SOC ranges from 10% to 90%). Here, a maximum capacity value in charging is estimated using a linear correlation between a distance ($\Delta Q$) between two feature points (maximum values) in the differential characteristics and the maximum capacity. The distance $\Delta Q$ represents the difference in capacity value Q between two maximum values of dV/dQ.

In "A unified open-circuit-voltage model of lithium-ion batteries for state-of-charge estimation and state-of-health monitoring", Caihao Weng et. al, journal of Power Sources 258 (2014), p. 228-237, charging/discharging characteristics are expressed using a function model, curve fitting of the function model is performed on measured values in an area corresponding to an SOC range of 10% to 90%, and parameters of the function model are identified. Then, feature points (maximum values) of differential characteristics "dQ/dV vs V" are acquired from the function model of which the parameters are identified. The maximum capacity at that time is estimated using a linear correlation between the acquired feature points and the maximum capacity.

In the above-mentioned related art, for example, measured data of charging or discharging in a broad section which is in the SOC range of 10% to 90%, but not in the whole SOC range, is required for acquiring the feature points necessary for estimation. When a secondary battery of which a maximum capacity is to be estimated is a single cell, a charging process can be performed in the SOC range of 0% to 100% and thus the feature points can be acquired in the broad range of 10% to 90% without any problems.

However, when the secondary battery of which the maximum capacity is to be estimated is a combination battery (a battery module) in which a plurality of cells are connected in series, degrees of deterioration of combined cells are different, and thus it is not possible to estimate the maximum capacity in the above-mentioned related art.

That is, when at least one cell having a very large degree of deterioration is mixed with cells of a secondary battery, the cell having a large degree of deterioration has a maximum capacity lower than that of the other cells having a small degree of deterioration. Accordingly, the inter-terminal voltage of the cell having a large degree of deterioration reaches an upper-limit voltage earlier than the cells having a small degree of deterioration. As a result, a charging process on all the cells including the cells having a small degree of deterioration is stopped due to the stopping of the cell having a large degree of deterioration. Accordingly, the charging process on the secondary battery ends in a state in which charging of the cells having a small degree of deterioration is not completely performed.

Accordingly, in the cells other than the cell having a large degree of deterioration, measured values in an SOC range required for acquiring feature points to be used to estimate the maximum capacity cannot be acquired. Accordingly, since the feature points to be used to estimate the maximum capacity cannot be acquired, it is not possible to estimate maximum capacities of the cells other than the cell having a large degree of deterioration.

On the other hand, from the viewpoint of efficient operation and safety of a battery management system (BMS), it is very important to understand maximum capacities of all cells in a secondary battery. Recently, a combination battery in which cells having different degrees of deterioration are combined is often used as a secondary battery. If maximum capacities of the cells having different degrees of deterioration cannot be estimated, it causes a severe problem in operation of the BMS.

In Japanese Unexamined Patent Application, First Publication No. 2014-002122, a maximum capacity is estimated on the premise that a capacity value between a first feature point and a second feature point has a linear correlation with the maximum capacity. That is, Japanese Unexamined Patent Application, First Publication No. 2014-002122 is based on the premise that a deterioration rate of the maximum capacity is the same in any capacity area.

In general, it is known that a peak in a curve of differential characteristics "dQ/dV vs V" appears when a crystal structure (a stage structure) of an active material, such as graphite which is widely used in a lithium ion battery, varies. When the crystal structure varies, Li ions are inserted into graphite. Here, an area obtained by performing integration between the feature points in the curve of differential characteristics "dQ/dV vs V" corresponds to the amount of charge Q inserted into graphite.

That is, in view of the curve of differential characteristics "dQ/dV vs V," the premise that the deterioration rate of the maximum capacity is the same in any capacity area corresponds to a decrease of dQ/dV on a vertical axis at the same rate.

A technique of estimating a battery state such as a maximum capacity or amounts of active materials of a positive electrode and a negative electrode by fitting them to measured values of some sections using a variable indicating a decrease rate of the maximum capacity on the basis of the premise that the maximum capacity decreases at the same rate in any process of variation in a crystal structure of graphite is also known (for example, see Japanese Unexamined Patent Application, First Publication No. 2009-080093).

However, it has also been reported that the variation rate of the maximum capacity in variation of crystal structures actually varies ("Aging of a Commercial Graphite/LiFePO4 Cell", M. Safari et. al, Journal of the Electrochemical Society 158 (10) A1123-A1135 (2011)), and thus the decrease rate of the maximum capacity in the variation of the crystal structure (feature points) is not necessarily the same as described in Japanese Unexamined Patent Application, First Publication Nos. 2014-002122, 2009-252381, and 2009-080093. That is, partially due to an influence of deterioration of a positive electrode in a lithium ion battery, an amount of lithium ions Li varies depending on variation areas (areas between the feature points) of a crystal structure of a graphite negative electrode. For example, the amount of Li ions, such as $LiC_6$, $LiC_{12}$, $LiC_{27}$, and $LiC_{36}$, inserted into the graphite negative electrode varies depending on the crystal structure. It is also considered that an influence level of the amount of Li ions to deterioration varies depending on the crystal structure, and the premise that the decrease rate of the maximum capacity in the variation of the crystal structure (feature points) are the same and a difference from an actual state in the lithium ion battery cause a capacity estimation error in estimation of the maximum capacity.

As described above, in the related art, measured values in a broad SOC range are necessary for acquiring feature points to be used to estimate a maximum capacity. Accordingly, when a cell of which the maximum capacity is deteriorated more than the other cells is present in a combination battery, there may be a cell of which the maximum capacity cannot be estimated.

A technique of estimating a maximum capacity by fitting it to measured values in some SOC ranges is also known. However, when the maximum capacity is estimated on the premise that an amount of charge Q charged in all processes of variation of a crystal structure decreases at the same rate due to deterioration of the secondary battery, a decrease rate of the amount of charge charged for every variation of the crystal structure may vary, which may be an error factor in the estimation of the maximum capacity.

SUMMARY OF THE INVENTION

The present invention is made in consideration of the above-mentioned circumstances and provides a secondary battery capacity measuring system and a secondary battery capacity measuring method that can estimate maximum capacities of other cells using characteristics of a deteriorated cell having a smaller maximum capacity than the other cells even when the deteriorated cell is present among cells constituting a battery module and data sufficient to measure the maximum capacities of the other cells cannot be acquired due to ending of a charging process for the deteriorated cell.

In order to achieve the above-mentioned object, according to an aspect of the present invention, there is provided a secondary battery capacity measuring system that measures a maximum capacity of a secondary battery including a plurality of cells, the secondary battery capacity measuring system including: a data converting unit configured to calculate a differential characteristic curve indicating differential characteristics with a capacity Q and a voltage value V of a battery in predetermined ranges as parameters from history data of measured values obtained by acquiring the voltage value V and a current value I of the battery in time series for each cell; a fitting processing unit configured to compare a reference differential curve indicating differential characteristics with the capacity Q and the voltage value V of a cell as parameters, the reference differential curve including a plurality of separated-wave differential curves multiplied by first coefficients and multiplied by a second coefficient indicating the deterioration ratio from an initially measured maximum capacity $Q_{ini}$ with a differential characteristic curve indicating differential characteristics with a measured capacity Q and a measured voltage value V of one cell selected from the plurality of cells as parameters and to calculate the first coefficients of the separated-wave differential curves; and a maximum capacity calculating unit configured to fit the reference differential curve using the first coefficients to a partial differential characteristic curve in a measured range of a non-selected cell other than the selected cell, to calculate the second coefficient, to multiply the maximum capacity $Q_{ini}$ by the second coefficient, and to set the multiplication result as an estimation result of the maximum capacity $Q_{max}$ of the non-selected cell, wherein the separated-wave differential curves include a differential characteristic curve based on material characteristics of a positive electrode and a differential characteristic curve based on material characteristics of a negative electrode.

According to an aspect of the present invention, in the secondary battery capacity measuring system, the fitting processing unit may map a correspondence between third coefficients of the separated-wave differential curves acquired from the fitting result and the second coefficient of the selected cell on a graph, and set slopes of regression lines formed by the third coefficients of the separated-wave differential curves and the second coefficient as the first coefficients.

According to an aspect of the present invention, in the secondary battery capacity measuring system, the differential characteristic curves, the partial differential characteristic curves, and the reference differential curve may include: a differential curve indicating a first correspondence between the voltage value V in the battery and a numerical value dQ/dV acquired by differentiating the capacity Q using a voltage variation d/dV as a differential operator; and a differential curve indicating a second correspondence between the capacity Q in the battery and a numerical value dV/dQ acquired by differentiating the voltage value V using a capacity variation d/dQ as a differential operator.

According to an aspect of the present invention, in the secondary battery capacity measuring system, the differential characteristic curve may be generated from measured values in a range including feature points derived from a separated-wave differential curve which is used to perform fitting for calculating the first coefficients of the separated-wave differential curves.

According to an aspect of the present invention, in the secondary battery capacity measuring system, the fitting processing unit may calculate the first coefficients to correspond to an ambient temperature of the secondary battery and write and store the first coefficients to and in a table indicating a correspondence between the temperature and the first coefficients, and the maximum capacity calculating unit may read the first coefficients corresponding to the ambient temperature of the secondary battery from the table and perform an operation of estimating the maximum capacity of the non-selected cell when estimating the maximum capacity of the non-selected cell.

According to an aspect of the present invention, in the secondary battery capacity measuring system, a deteriorated cell having a smallest maximum capacity may be selected and used as the selected cell from the plurality of cells of the secondary battery.

According to an aspect of the present invention, in the secondary battery capacity measuring system, a plurality of cells including a deteriorated cell having a smallest maximum capacity may be selected and used as the selected cell from the plurality of cells of the secondary battery.

According to an aspect of the present invention, the secondary battery capacity measuring system may further include a balance circuit configured to shift a capacity position at which charging of the deteriorated cell is started so as to measure the capacity Q and the voltage value V of the selected cell within a range including feature points similar to the deteriorated cell.

According to an aspect of the present invention, there is also provided a secondary battery capacity measuring method of measuring a maximum capacity of a secondary battery including a plurality of cells, the secondary battery capacity measuring method including: a data converting step of causing a data converting unit to calculate a differential characteristic curve indicating differential characteristics with a capacity Q and a voltage value V of a battery in predetermined ranges as parameters from history data of measured values obtained by acquiring the voltage value V and a current value I of the battery in time series for each cell; a fitting processing step of causing a fitting processing unit to compare a reference differential curve indicating differential characteristics with the capacity Q and the voltage value V of a cell as parameters, the reference differential curve including a plurality of separated-wave differential curves multiplied by first coefficients and multiplied by a second coefficient indicating a deterioration ratio from an initially measured maximum capacity $Q_{ini}$ with a differential characteristic curve indicating differential characteristics with the measured capacity Q and the measured voltage value V of one cell selected from the plurality of cells as parameters, and to calculate the first coefficients of the separated-wave differential curves; and a maximum capacity calculating step of causing a maximum capacity calculating unit to fit the reference differential curve using the first coefficients to a partial differential characteristic curve in a measured range of a non-selected cell other than the selected cell, to calculate the second coefficient, to multiply the maximum capacity $Q_{ini}$ by the second coefficient, and to set the multiplication result as an estimation result of the maximum capacity $Q_{max}$ of the non-selected cell, wherein the separated-wave differential curves include a differential characteristic curve based on material characteristics of a positive electrode and a differential characteristic curve based on material characteristics of a negative electrode.

As described above, according to aspects of the present invention, it is possible to estimate maximum capacities of other cells using characteristics of a deteriorated cell having a smaller maximum capacity than the other cells even when the deteriorated cell is present among cells constituting a battery module and data sufficient to measure the maximum capacities of the other cells cannot be acquired due to ending of a charging process for the deteriorated cell.

BRIEF DESCRIPTION OF THE DRAWINGS

The above features and advantages of the present invention will be more apparent from the following description of certain preferred embodiments taken in conjunction with the accompanying drawings.

FIG. 3 is a diagram showing generation of a measured differential characteristic curve L4 in the embodiment.

FIG. 8 is a diagram showing estimation of a maximum capacity value of a non-selected cell using coefficients k1, k2, k3, and k4 acquired in a deteriorated cell.

FIG. 14 is a diagram showing an example of a configuration of a temperature-correlated coefficient table indicating a correspondence between temperature and coefficients k1, k2, k3, and k4.

DETAILED DESCRIPTION OF THE INVENTION (First Embodiment)

According to the present invention, a reference which is used to calculate a state of charge (SOC) and a maximum capacity of a battery, for example, a secondary battery (a lithium ion battery in this embodiment), is generated from differential curves of a separated-wave model based on differentials of a voltage value V and a capacity value Q for each of a positive electrode and a negative electrode, which are acquired by simulation based on material characteristics of the positive electrode and the negative electrode of the secondary battery.

That is, each of the positive electrode and the negative electrode of the battery has a specific separated-wave differential curve (for example, a differential curve indicating a correspondence between a differential value dQ/dV and the voltage value V) as a separated-wave model for each of the positive electrode and the negative electrode due to a phase transition phenomenon specific to electrode materials thereof. The separated-wave differential curves of the positive electrode and the negative electrode have specific peaks that are different from each other. Here, the separated-wave differential curves as the separated-wave models derived from the positive electrode and the negative electrode can be expressed by a Gaussian function, a Lorentz function, a function including an asymmetric factor, or the like.

Accordingly, as characteristics (a differential curve) of a battery including a positive electrode and a negative electrode as a whole, a combined-wave differential characteristic curve in which separated-wave differential curves are combined is observed. Therefore, the separated-wave differential curves derived from the positive electrode and the negative electrode are calculated by simulation using the above-mentioned arbitrary function. Then, the separated-wave differential curves derived from the positive electrode and the negative electrode are combined, for example, on the basis of battery characteristics, to generate a differential characteristic curve indicating a correspondence between the differential value dQ/dV and the voltage value V of the battery. The differential characteristic curve indicating a correspondence between the differential value dQ/dV and the voltage value V of the battery is used as a first reference differential curve. In the first reference differential curve, a maximum capacity $Q_{max}$ of the battery is estimated (calculated) by integrating the differential value dQ/dV in an available voltage (an operating voltage) range with respect to the voltage value V.

Figure 1:
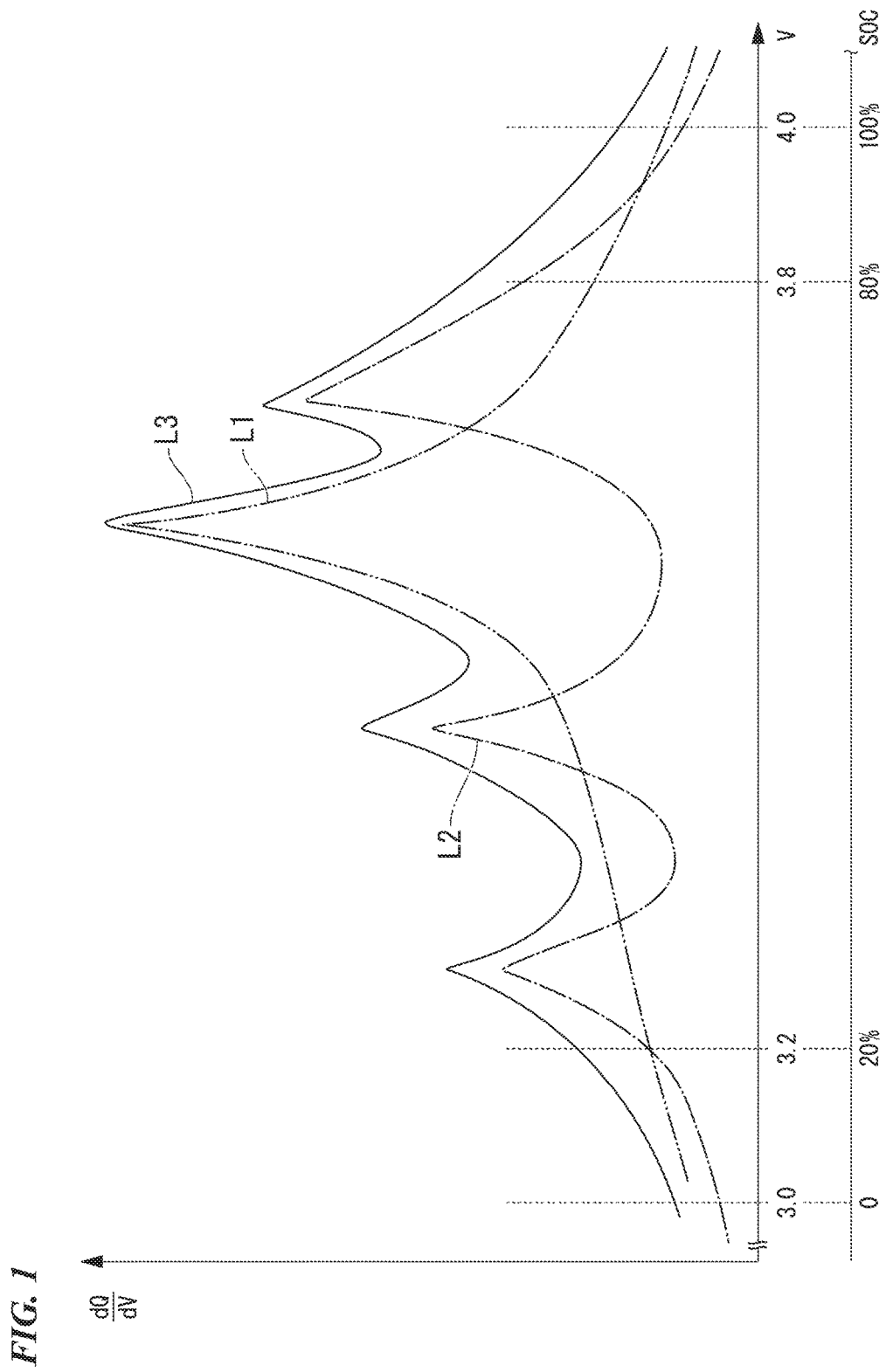
FIG. 1 is a diagram showing a correspondence of a first reference differential curve and separated-wave differential curves derived from a positive electrode and a negative electrode.

FIG. 1 is a diagram showing a correspondence of the first reference differential curve (differential characteristic curve) and the separated-wave differential curves derived from the positive electrode and the negative electrode according to an embodiment of the present invention. In FIG. 1, the vertical axis represents the differential value dQ/dV and the horizontal axis represents the voltage value V. The first reference differential curve is combined from two or more separated-wave differential curves. For example, in FIG. 1, curve L1 represents the separated-wave differential curves derived from the positive electrode, curve L2 represents the separated-wave differential curve derived from the negative electrode, and curve L3 represents an example of a differential characteristic curve (first reference differential curve) which is obtained by combining the curves L1 and L2 on the basis of battery characteristics. When a voltage range from 3.0 V to 4.0 V is set as a suppliable voltage range corresponding to a load, a capacity supplied in the voltage range of 3.0 V to 4.0 V is the maximum capacity $Q_{max}$ in specifications of the battery. An axis indicating an SOC is disposed below the horizontal axis parallel to the horizontal axis and represents a ratio of a remaining capacity to the maximum capacity $Q_{max}$ for each voltage. In this embodiment, for example, in a two-dimensional coordinate plane of the differential value dQ/dV and the voltage value V, the first reference differential curve is combined from the separated-wave differential curves derived from the positive electrode and the negative electrode, but differential curves combined on the two-dimensional coordinate plane of the differential value dQ/dV and the voltage value V may be converted to the two-dimensional coordinate plane of the differential value dQ/dV and the voltage value V to generate the first reference differential curve.

The first reference differential curve is expressed, for example, by Equation (1) described below. The first reference differential curve (for example, the curve L3) is constituted by two or more separated-wave differential curves (for example, the curve L1 and the curve L2). Equation (1) expresses, for example, a combined curve combined from separated-wave differential curves $(f(V))_{Peak1}$ and $(f(V))_{Peak2}$.

$$f(V) = P\{k_1(f(V))_{Peak1} + k_2(f(V))_{Peak2}\} \quad (1)$$

In Equation (1), P denotes a coefficient (second coefficient) relevant to all of the separated-wave differential curves $(f(V))_{Peak1}$ and $(f(V))_{Peak2}$. $k_1$ and $k_2$ denote coefficients (first coefficient) relevant to the separated-wave differential curves $(f(V))_{Peak1}$ and $(f(V))_{Peak2}$, respectively.

In FIG. 1, the curve L1 represents the separated-wave differential curve $(f(V))_{Peak1}$, and the curve L2 represents the separated-wave differential curve $(f(V))_{Peak2}$.

Figure 2:
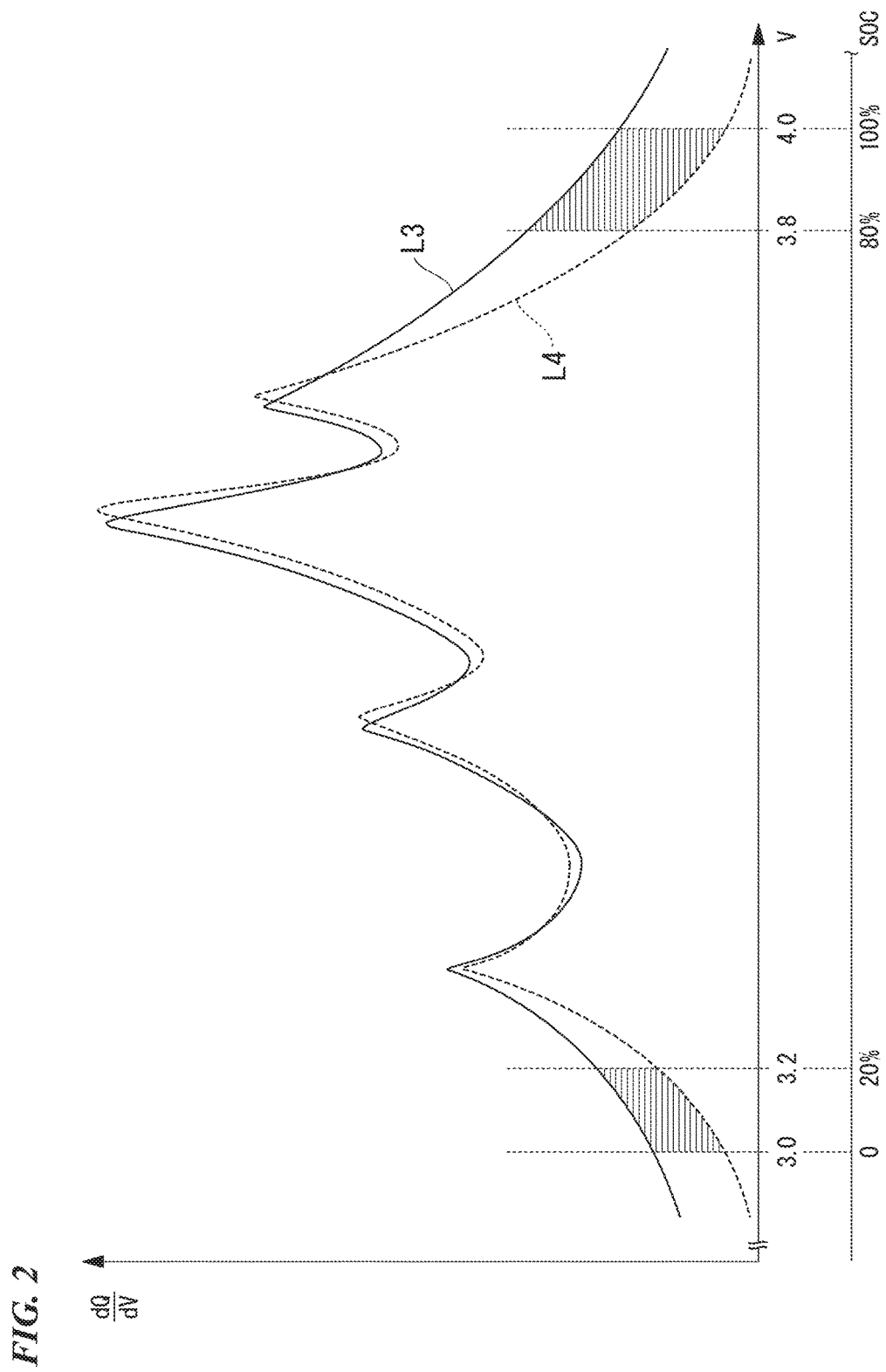
FIG. 2 is a diagram showing preparation of a first reference differential curve by fitting it to a measured differential characteristic curve using measured values.

FIG. 2 is a diagram showing generation of the first reference differential curve by fitting it to a measured differential characteristic curve (a first measured differential characteristic curve) using measured values. In FIG. 2, the vertical axis represents the differential value dQ/dV and the horizontal axis represents the voltage value V. The solid line (the curve L3) represents the differential characteristic curve (the first reference differential curve combined from the above-mentioned two or more separated-wave differential curves) and the dotted line (the curve L4) represents a measured differential characteristic curve obtained from measurement of the battery.

After the separated-wave differential curves derived from the positive electrode and the negative electrode are combined to generate the first reference differential curve (differential characteristic curve) L3, the differential characteristic curve L3 is fitted to the measured differential characteristic curve L4. Here, parameters in functions expressing the separated-wave differential curves derived from the positive electrode and the negative electrode, which constitute the differential characteristic curve, are adjusted. Optimization of the first reference differential curve (differential characteristic curve) L3, which is combined from the separated-wave differential curves derived from the positive electrode and the negative electrode, to the measured differential characteristic curve L4 is performed.

Function f(v) in the function expressed by Equation (1) includes coefficients for adjusting asymmetry, a peak width, a peak voltage, and the like.

The coefficients $k_1$ and $k_2$ are parameters for adjusting peak heights of the separated-wave differential curves $(f(V))_{Peak1}$ and $(f(V))_{Peak2}$. The coefficient P is a coefficient denoting a ratio of a variation of a maximum capacity value (a variation rate) obtained by dividing the maximum capacity value varying with the lapse of time by an initial value of the maximum capacity value of a cell from which the first reference differential curve is prepared and adjusting a peak height so that the first reference differential curve affects commonly to all of the separated-wave differential curves.

That is, a process of fitting the differential characteristic curve L3 (the first reference differential curve) to the measured differential characteristic curve L4 is performed and the coefficients $k_1$ and $k_2$ of the separated-wave differential curves derived from the positive electrode and the negative electrode in Equation (1) are calculated. Then, by repeatedly performing a process of combining adjusted separated-wave differential curves derived from the positive electrode and the negative electrode to prepare a new differential characteristic curve L3 and a process of comparing the differential characteristic curve L3 with the measured differential characteristic curve L4 until an absolute value of a difference (an error) between the differential characteristic curve L3 and the measured differential characteristic curve L4 is minimized, optimization causing a shape of the differential characteristic curve L3 to be similar to the measured differential characteristic curve L4 is performed. In this embodiment, the differential characteristic curve L3 at a time point at which the absolute value of the error is minimized is used as the first reference differential curve.

In FIG. 2, hatched areas in a voltage range of 3.0 V to 3.2 V and a voltage range of 3.8 V to 4.0 V indicate areas in which the error between the differential characteristic curve obtained by simulation and the measured differential characteristic curve is large and in which it is difficult to fit them to each other. That is, the hatched areas in the voltage range of 3.0 V to 3.2 V and the voltage range of 3.8 V to 4.0 V are areas which are difficult to express by simulation using a separated-wave model. Accordingly, when the maximum capacity $Q_{max}$ is calculated using the first reference differential curve which is generated only by adjusting the differential characteristic curve calculated by simulation, the maximum capacity $Q_{max}$ obtained by integrating the differential value dQ/dV in an available voltage range includes an error of the capacity Q of the hatched areas in FIG. 2.

Accordingly, in this embodiment, the first reference differential curve in areas corresponding to the hatched areas is replaced with measured values of the corresponding areas of the measured differential characteristic curve. In the areas having a large error, it is known by experiment that a variation due to deterioration is much smaller than that of the other areas, and it is possible to suppress an error in the maximum capacity $Q_{max}$ in comparison with a case in which the differential characteristic curve obtained by simulation is used.

In order to simplify processing, the first reference differential curve may be calculated and used using only the differential characteristic curve obtained by simulation.

Lithium ion secondary batteries may have an individual difference between products in the maximum capacity $Q_{max}$ even in the same lot due to a slight difference in weight or pre-doped dose of an active material at a time of manufacturing a battery. This originates from a characteristic difference between individuals in large-gradient areas at both ends in a curve indicating a relationship between the capacity Q and the voltage value V. The large-gradient areas (hatched areas) at both ends in the curve indicating a relationship between the capacity Q and the voltage value V are areas having a large voltage variation and are areas in which characteristics greatly vary due to a slight difference such as an individual difference in pre-doped dose of the positive electrode and the negative electrode of the battery.

As described above, since the above-mentioned areas (hatched areas) are very sensitive, it is very difficult for the areas to be expressed by a combination of separated-wave models.

In this embodiment, when initial data of the large-gradient areas at both ends in the curve indicating a relationship between the capacity Q and the voltage value V of the battery individual is acquired in advance, characteristics of a range other than a predetermined voltage range with threshold values (Vlower, Vupper) may be constructed by a model using characteristics of the curve of the capacity Q and the voltage value V which is measured and stored in advance as described above.

That is, in this embodiment, as for the areas which are difficult to express by combination of separated-wave models, the maximum capacity $Q_{max}$ can be more accurately estimated by constructing a model of the first reference differential curve using initially measured data of the battery.

FIG. 3 is a diagram showing generation of the measured differential characteristic curve L4 in this embodiment. In (a) of FIG. 3, the horizontal axis represents the capacity Q of a cell and the vertical axis represents an inter-terminal voltage of the cell. As shown in (a) of FIG. 3, when a secondary battery is configured as a combination battery of a plurality of cells, a deterioration state varies depending on the cells and the capacity Q at the inter-terminal voltage at which charging ends varies. In a deteriorated cell, since the maximum capacity decreases, the inter-terminal voltage reaches an upper limit earlier than the other cells.

For example, in (a) of FIG. 3, by forming a curve L100 indicating the relationship between the capacity Q and the inter-terminal voltage value V of a cell which deteriorates more severely than the other cells (hereinafter, referred to as a deteriorated cell) with a curve L101 indicating a relationship between the capacity Q and the inter-terminal voltage value V of the other cells, the capacity Q (the maximum capacity) at which the inter-terminal voltage of the deteriorated cell reaches the upper-limit voltage can be seen to be earlier than the other cells.

In (b) of FIG. 3, the horizontal axis represents the capacity Q and the vertical axis represents the differential value dQ/dV of a cell. The curve indicating a correspondence between the differential value dQ/dV and the capacity Q shown in FIG. 3 is a second differential characteristic curve including a data set indicating the correspondence between the differential value dQ/dV and the capacity Q. A second differential characteristic curve L200 is a second differential characteristic curve of a deteriorated cell and is a curve for calculating the measured differential characteristic curve L3 in an area including all peaks of the separated-wave differential curves $((f(V))_{Peak1}$ and $(f(V))_{Peak2}$ in the first reference differential curve. The first reference differential curve of the deteriorated cell can be fitted using the second differential characteristic curve L200 to calculate the coefficients k1 and k2.

On the other hand, as for a second differential characteristic curve L201, the measured differential characteristic curve L4 in an area including all peaks of the separated-wave differential curves $((f(V))_{Peak1}$ and $(f(V))_{Peak2}$ in the first reference differential curve cannot be obtained. That is, the first reference differential curve cannot be fitted using the second differential characteristic curve L201 to calculate the coefficients k1 and k2.

Accordingly, in this embodiment, the coefficients k1 and k2 are calculated using the first reference differential curve corresponding to the deteriorated cell and are used as the coefficients k1 and k2 of the separated-wave differential curves $(f(V))_{Peak1}$ and $(f(V))_{Peak2}$ of the first reference differential curve corresponding to another cell.

Figure 4:
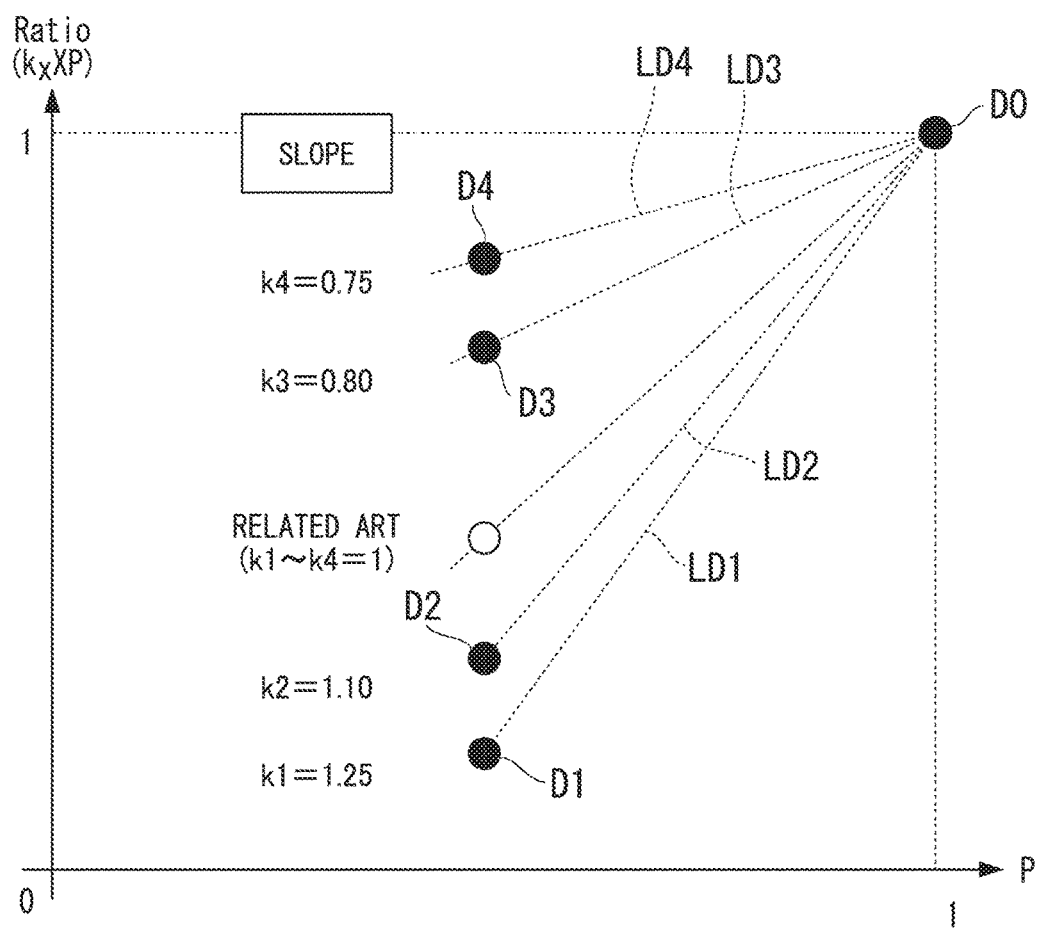
FIG. 4 is a diagram showing a process of identifying coefficients k1, k2, k3, and k4.

FIG. 4 is a diagram showing a process of identifying the coefficients (first coefficient) $k_1$, $k_2$, $k_3$, and $k_4$, when the first reference differential curve is constituted by four separated-wave differential curves. Here, the first reference differential curve is a combined curve combined from separated-wave differential curves $(f(V))_{Peak1}$, $(f(V))_{Peak2}$, and $(f(V))_{Peak3}$, $(f(V))_{Peak4}$.

$$f(V)=P\{k_1(f(V))_{Peak1}+k_2(f(V))_{Peak2}+k_3(f(V))_{Peak3}+k_4(f(V))_{Peak4}\} \quad (1)'$$

In the graph of FIG. 4, the horizontal axis represents a numerical value of P (second coefficient) and the vertical axis represents a numerical value of kx×P (third coefficient). In FIG. 4, x satisfies 1≤x≤4 and kx indicates the coefficients $k_1$ to $k_4$ (first coefficient). The coefficient P (second coefficient) is calculated by dividing a maximum capacity at each measuring time by an initial maximum capacity. That is, an initial value of the maximum capacity of the deteriorated cell is measured as the initial maximum capacity at a time of first charging the secondary battery. In FIG. 4, at the time of first charging the secondary battery, since the initial maximum capacity as an initial value D0 is divided by the same initial maximum capacity, the coefficient P is "1" and the coefficients $k_1$, $k_2$, $k_3$, and $k_4$ are set to "1." The initial value D0 is plotted on the graph shown in FIG. 4.

Thereafter, when data for forming the measured differential characteristic curve L4 in the area including all peaks of the separated-wave differential curves $((f(V))_{Peak1}$, $(f(V))_{Peak2}$, $(f(V))_{Peak3}$, and $(f(V))_{Peak4})$ in the first reference differential curve is obtained, the first reference differential curve (the differential characteristic curve L3) of the deteriorated cell is fitted and the corrected values of the coefficients $k_1$, $k_2$, $k_3$, and $k_4$ are calculated. At this time, the coefficient P is used as a result obtained by dividing the maximum capacity at that time by the initial maximum capacity. That is, Equation (1) is transformed into Equation (2).

$$f(V)=P \cdot k_1(f(V))_{Peak1}+P \cdot k_2(f(V))_{Peak2}+P \cdot k_3(f(V))_{Peak3}+P \cdot k_4(f(V))_{Peak4} \quad (2)$$

Then, a process of fitting the first reference differential curve expressed by Equation (2) to the measured differential characteristic curve L4 is performed, and coefficients (third coefficient) $P \cdot k_1$, $P \cdot k_2$, $P \cdot k_3$, and $P \cdot k_4$ are calculated as the coefficients of the separated-wave differential curves $(f(V))_{Peak1}$, $(f(V))_{Peak2}$, $(f(V))_{Peak3}$, and $(f(V))_{Peak4}$. Thereafter, the coefficients $P \cdot k_1$, $P \cdot k_2$, $P \cdot k_3$, and $P \cdot k_4$ calculated by the fitting are plotted on FIG. 4 as fitting results D1, D2, D3, and D4, respectively.

Then, regression lines LD1, LD2, LD3, and LD4 connecting the initial value D0 and the results D1 to D4 are formed. Slopes of the regression lines LD1, LD2, LD3, and LD4 are calculated and the calculated slopes are set as the coefficients $k_1$, $k_2$, $k_3$, and $k_4$.

Whenever a fitting process is performed, the deteriorated cell is further deteriorated and the maximum capacity decreases. Accordingly, with the different coefficient P, a plurality of results D1, D2, D3, and D4 are plotted on the graph of FIG. 4, and each of the results D1, D2, D3, and D4 includes two or more results. When the result D1 includes two or more results, the regression line LD1 is generated with the initial value D0 as an origin such that distances from the results D1 are minimized by a least square method. The other regression lines LD2, LD3, and LD4 are generated to correspond to the results D1, D2, D3, and D4, similarly to the above-mentioned regression line LD1. Accordingly, with an increase of the results D1, D2, D3, and D4, the coefficients $k_1$, $k_2$, $k_3$, and $k_4$ are calculated with higher accuracy. The first reference differential curve of a cell other than the deteriorated cell in the secondary battery is generated using the coefficients $k_1$, $k_2$, $k_3$, and $k_4$ which are sequentially updated. The maximum capacity of the cell other than the deteriorated cell in the secondary battery is estimated using the generated first reference differential curve.

Figure 5:
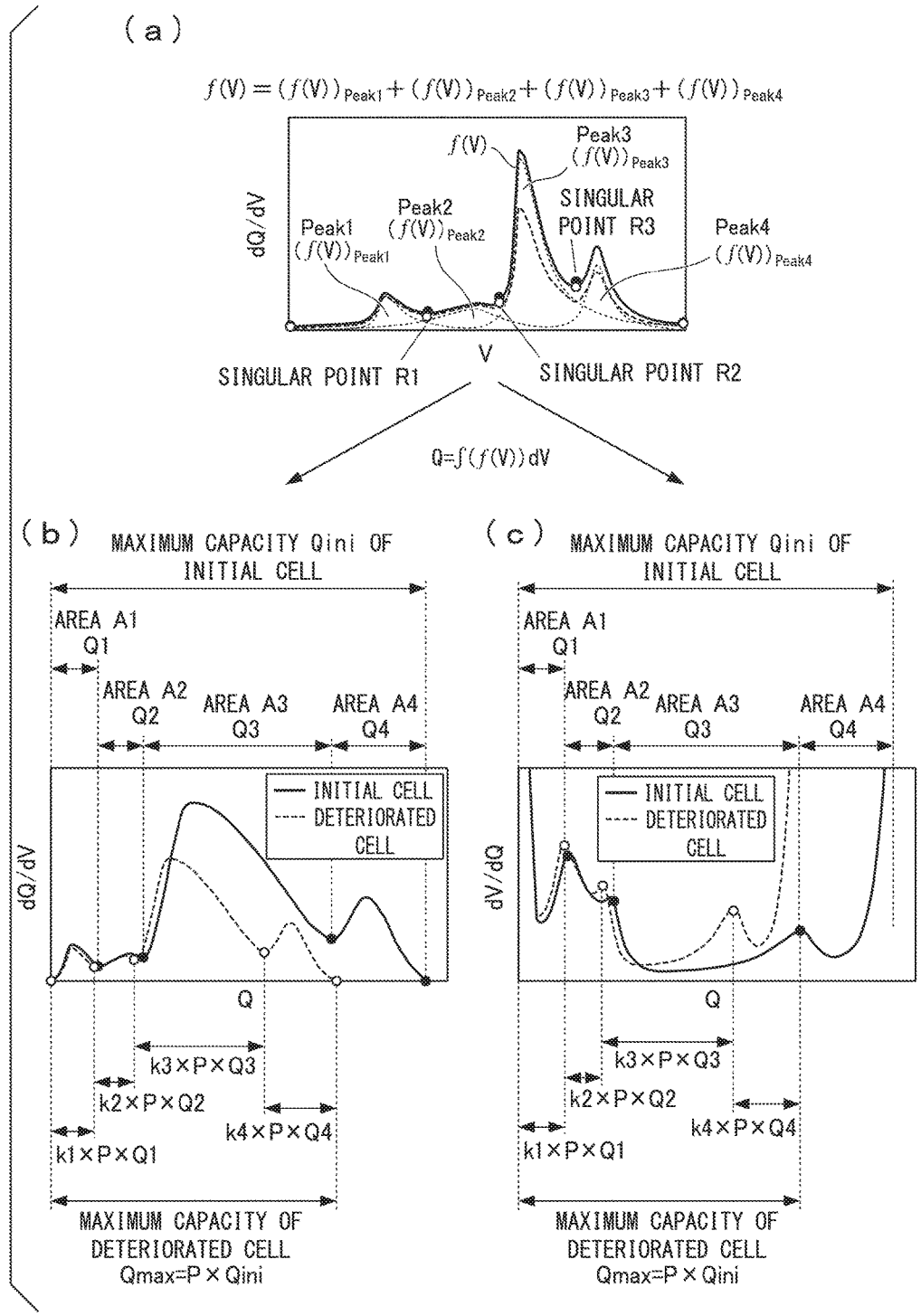
FIG. 5 is a diagram showing characteristics of a differential value dQ/dV and an inter-terminal voltage value V at a time of charging of a secondary battery.

FIG. 5 is a diagram showing characteristics of the differential value dQ/dV and the inter-terminal voltage value V at the time of charging of the secondary battery. (a) of FIG. 5 shows the first reference differential curve indicating a correspondence between the differential value dQ/dV and the inter-terminal voltage value V, in which the vertical axis represents the differential value dQ/dV and the horizontal axis represents the inter-terminal voltage value V. As described above with reference to FIG. 1, the first reference differential curve indicates the correspondence between the differential value dQ/dV and the inter-terminal voltage value V of a lithium ion battery and has characteristics including a plurality of peaks. Here, the first reference differential curve (differential characteristic curve) is prepared by combining the separated-wave differential curves $(f(V))_{Peak1}$, $(f(V))_{Peak2}$, $(f(V))_{Peak3}$, and $(f(V))_{Peak4}$. Accordingly, in (a) of FIG. 5, Peak1 is a peak of the separated-wave differential curve $(f(V))_{Peak1}$, Peak2 is a peak of the separated-wave differential curve $(f(V))_{Peak2}$, Peak3 is a peak of the separated-wave differential curve $(f(V))_{Peak3}$, and Peak4 is a peak of the separated-wave differential curve $(f(V))_{Peak4}$.

For example, in (a) of FIG. 5, $(f(V))_{Peak1}$ and $(f(V))_{Peak2}$ represent the separated-wave differential curves derived from the positive electrode, $(f(V))_{Peak3}$ and $(f(V))_{Peak4}$ represent the separated-wave differential curve derived from the negative electrode.

Singular points R1, R2, and R3 indicate switching points of ranges of influence of the separated-wave differential curves $(f(V))_{Peak1}$, $(f(V))_{Peak2}$, $(f(V))_{Peak3}$, and $(f(V))_{Peak4}$, respectively. That is, in this embodiment, the first reference differential curve is expressed by the separated-wave differential curves $(f(V))_{Peak1}$, $(f(V))_{Peak2}$, $(f(V))_{Peak3}$, and $(f(V))_{Peak4}$ in which varying processes (stages) of crystal structures of active materials of a cell (a lithium ion battery) are expressed by functions. Accordingly, the singular points R1, R2, and R3 indicate variation points of the crystal structure, that is, stage switching in charging characteristics.

(b) of FIG. 5 shows a differential curve indicating a correspondence between the differential value dQ/dV and the capacity Q, in which the vertical axis represents the differential value dQ/dV and the horizontal axis represents the capacity Q. An area A1 indicates a stage of charging characteristics based on the separated-wave differential curve $(f(V))_{Peak1}$. Similarly, an area A2 indicates a stage of charging characteristics based on the separated-wave differential curve $(f(V))_{Peak2}$. An area A3 indicates a stage of charging characteristics based on the separated-wave differential curve $(f(V))_{Peak3}$. An area A4 indicates a stage of charging characteristics based on the separated-wave differential curve $(f(V))_{Peak4}$. Here, a capacity Q1 indicates a capacity value with which a cell in an initial state (an initial cell) is charged in the stage of the area A1. A capacity Q2 indicates a capacity value with which the initial cell is charged in the stage of the area A2. A capacity Q3 indicates a capacity value with which the initial cell is charged in the stage of the area A3. A capacity Q4 indicates a capacity value with which the initial cell is charged in the stage of the area A4. That is, the maximum capacity of the initial cell is obtained by adding the capacities Q1, Q2, Q3, and Q4.

On the other hand, a capacity k1×P×Q1 indicates a capacity value with which a cell in a deteriorated state (a deteriorated cell) is charged in the stage of the area A1. A capacity k2×P×Q2 indicates a capacity value with which the deteriorated cell is charged in the stage of the area A2. A capacity k3×P×Q3 indicates a capacity value with which the deteriorated cell is charged in the stage of the area A3. A capacity k4×P×Q4 indicates a capacity value with which the deteriorated cell is charged in the stage of the area A4. That is, the maximum capacity of the deteriorated cell is obtained by adding the capacity values k1×P×Q1, k2×P×Q2, k3×P×Q3, and k4×P×Q4.

The coefficient P used herein is a coefficient indicating a deterioration ratio which is obtained by dividing the maximum capacity at a time of measurement by the initial maximum capacity of the deteriorated cell, that is, by dividing the maximum capacity ($Q_{max}$) of the initial cell by an initial maximum capacity ($Q_{ini}$) of the deteriorated cell. The coefficients k1, k2, k3, and k4 are coefficients indicating characteristics of the separated-wave differential curves obtained by the process of fitting the first reference differential curve described above with reference to FIG. 4 to the measured differential characteristic curve.

(c) of FIG. 5 shows a second reference differential curve indicating a correspondence between the differential value dV/dQ and the capacity Q, in which the vertical axis represents the differential value dV/dQ and the horizontal axis represents the capacity Q. The differential values dV/dQ at the singular points R1, R2, and R3 indicate maximum values. From this phenomenon, the capacity value Q1 with which the cell is charged in the area A1 is considered to substantially correspond to an amount of charge with which the cell is charged at the peak Peak1 of the first reference differential curve shown in (a) of FIG. 5. Similarly, the capacity value Q2 with which the cell is charged in the area A2 is considered to substantially correspond to an amount of charge with which the cell is charged at the peak Peak2 of the first reference differential curve shown in (a) of FIG. 5. The capacity value Q3 with which the cell is charged in the area A3 is considered to substantially correspond to an amount of charge with which the cell is charged at the peak Peak3 of the first reference differential curve shown in (a) of FIG. 5. The capacity value Q4 with which the cell is charged in the area A4 is considered to substantially correspond to an amount of charge with which the cell is charged at the peak Peak4 of the first reference differential curve shown in (a) of FIG. 5.

As described above, in this embodiment, by measuring a range of an area including the above-mentioned singular points R1, R2, and R3, that is, including the peaks of the separated waveform, the variables P, k1, k2, k3, and k4 can be identified by the process of fitting the first reference differential curve to the measured differential characteristic curve.

According to this embodiment, by introducing the coefficient P indicating a ratio of the maximum capacity ($Q_{max}$) and the initial maximum capacity ($Q_{ini}$) of the deteriorated cell and the coefficients k1, k2, k3, and k4 which are weighting coefficients for the separated-wave differential curves using the separated-wave differential curves $(f(V))_{Peak1}$, $(f(V))_{Peak2}$, $(f(V))_{Peak3}$, and $(f(V))_{Peak4}$, it is possible to determine the capacity values (Q1 to Q4) with which the cell is charged in the stages corresponding to the separated-wave differential curves for each peak of the separated-wave differential curves.

Figure 6:
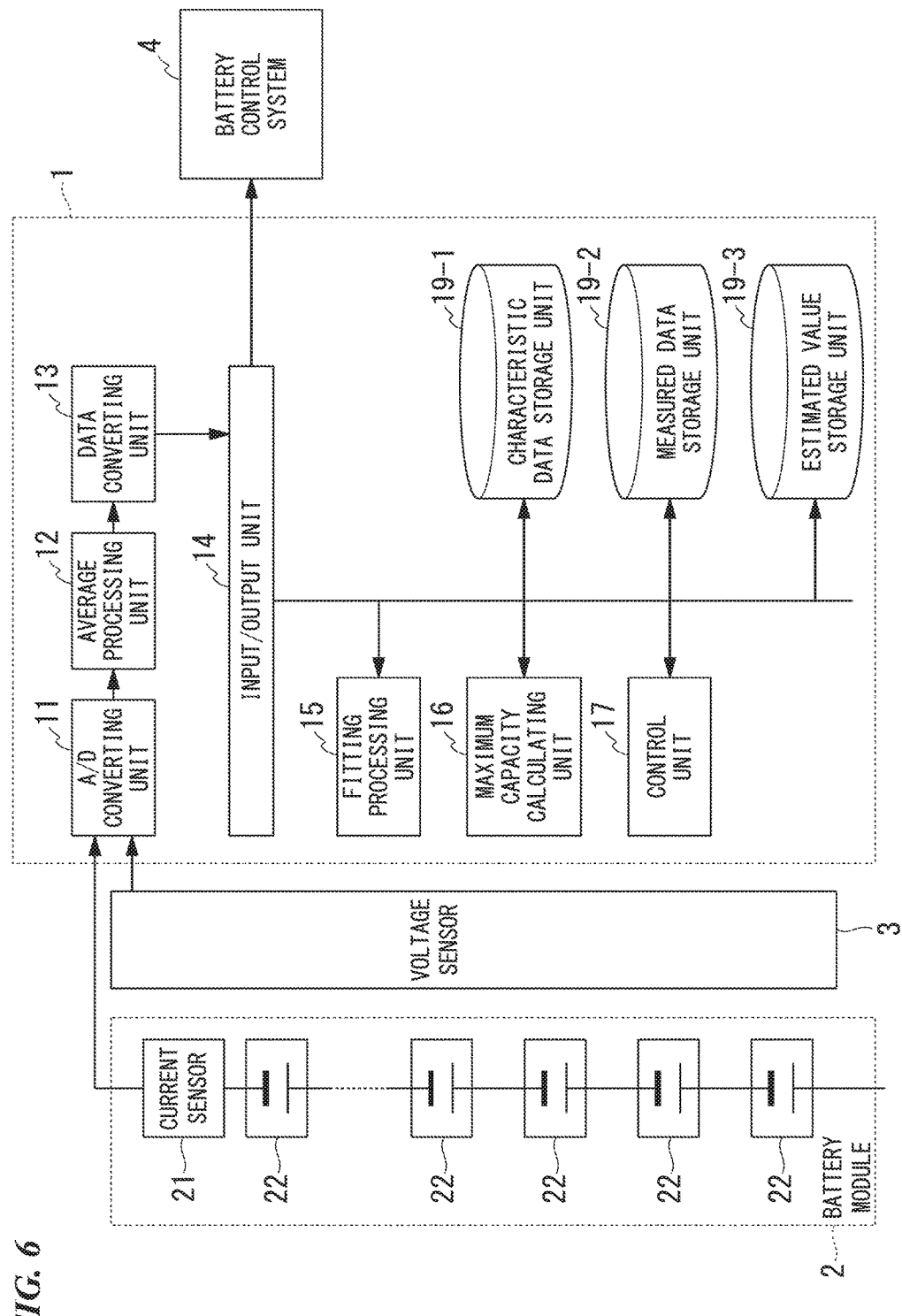
FIG. 6 is a diagram showing an example in which a capacity of a secondary battery is measured using an example of a configuration of a secondary battery capacity measuring system according to a first embodiment of the present invention.

Hereinafter, a secondary battery capacity measuring system according to a first embodiment of the present invention using the aforementioned separated-wave model (a model in which a first reference differential curve is expressed by combining separated-wave differential curves) will be described with reference to the accompanying drawings. FIG. 6 is a diagram showing an example in which a capacity of a secondary battery is measured using an example of a configuration of the secondary battery capacity measuring system according to the first embodiment of the present invention. A secondary battery capacity measuring system 1 includes an A/D converting unit 11, an average processing unit 12, a data converting unit 13, an input/output unit 14, a fitting processing unit 15, a maximum capacity calculating unit 16, a control unit 17, a characteristic data storage unit 19-1, a measured data storage unit 19-2, and an estimated value storage unit 19-3. A battery module 2 includes a current sensor 21 and a plurality of batteries (cells) 22, and supplies power to a load which is not shown. Here, the current sensor 21 measures a current value I which flows in the battery module 2 as a secondary battery. A voltage sensor 3 measures an inter-terminal voltage of the battery module 2 which is a voltage value of a combination of all of the cells 22 or inter-terminal voltages of the cells 22 of the battery module 2. A battery control system 4 controls charging and discharging operations of the battery module 2 on the basis of an SOC and the maximum capacity $Q_{max}$ which are supplied from the secondary battery capacity measuring system 1.

The A/D converting unit 11 samples the voltage value V measured by the voltage sensor 3 and the current value I measured by the current sensor 21 in a predetermined sampling period and converts analog data of the sampled measured values into digital data.

The average processing unit 12 averages and outputs the current values I and the voltage values V which have been measured and converted into digital data. For example, in order to reduce the number of data pieces, a process of averaging the digital data corresponding to 10 sampling periods is performed to obtain 1/10 the amount of data of sampling periods. The averaging process employs an area average, a moving average, or the like. The average processing unit 12 integrates the current value I in a predetermined period, and calculates the capacity Q as a variation in capacity in the predetermined period.

The data converting unit 13 prepares a data set indicating a correspondence among the differential value dQ/dV, which is obtained by differentiating the capacity Q using a differential operator d/dV, the voltage value V, and the current value I using the averaged voltage value V and the calculated capacity Q, and outputs the data set to the input/output unit 14 in time series.

The data converting unit 13 prepares a data set indicating a correspondence between the differential value dV/dQ, which is obtained by differentiating the voltage value V using the differential operator d/dQ, the capacity Q, and the current value I using the averaged voltage value V and the calculated capacity Q, and outputs the prepared data set to the input/output unit 14 in time series.

The input/output unit 14 writes and stores the data set of the differential value dQ/dV and the voltage value V and the data set of the differential value dV/dQ and the capacity Q, which are supplied from the data converting unit 13, to and in the measured data storage unit 19-2 in time series. Here, a data set in a predetermined period is stored in the measured data storage unit 19-2. The measured data storage unit 19-2 has, for example, a ring buffer configuration in which a data set of a length of one hour in time series is stored and an old data set one hour earlier is sequentially overwritten with a new data set.

The input/output unit 14 outputs the maximum capacity $Q_{max}$ which is estimated by the maximum capacity calculating unit 16 described later to the battery control system 4.

The fitting processing unit 15 calculates the coefficients k1, k2, k3, and k4 of the first reference differential curve by the fitting process based on the process described above with reference to FIG. 4 using a first differential characteristic curve (a measured differential characteristic curve) including a data group in a predetermined time range of the data set indicating a correspondence between the differential value dQ/dV and the voltage value V, which is read from the measured data storage unit 19-2, and a second differential characteristic curve (a measured differential characteristic curve) including a data group in a predetermined time range of the data set indicating the correspondence between the differential value dV/dQ and the capacity Q.

The fitting processing unit 15 divides the maximum capacity of the deteriorated cell at a time point at which the coefficients are changed by the initial maximum capacity of the cell used to identify the coefficients k1, k2, k3, and k4, that is, the deteriorated cell in this embodiment, and acquires the division result as the coefficient P. The fitting processing unit 15 writes and stores the acquired coefficients k1, k2, k3, and k4 to and in the measured data storage unit 19-2. The fitting processing unit 15 writes and stores the initial maximum capacity of the cell used to identify the coefficients k1, k2, k3, and k4, that is, the deteriorated cell in this embodiment, to and in the measured data storage unit 19-2.

Figure 7:
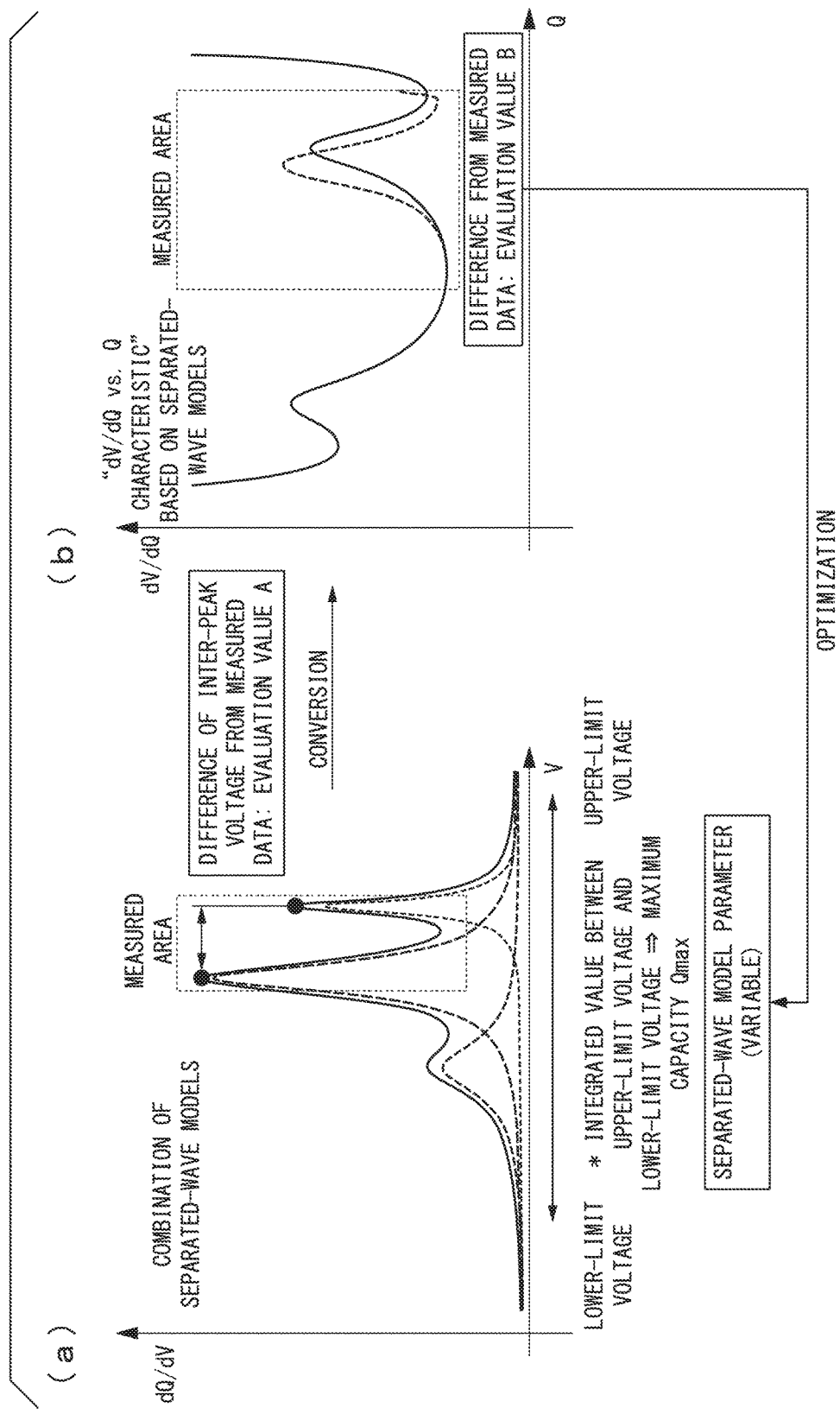
FIG. 7 is a diagram showing a process of fitting a first reference differential curve in a fitting processing unit 15.

FIG. 7 is a diagram showing the process of fitting the first reference differential curve in the fitting processing unit 15.

In (a) of FIG. 7, the vertical axis represents the differential value dQ/dV and the horizontal axis represents the voltage value V. (a) of FIG. 7 shows adjusting the coefficients k1, k2, k3, and k4 of the separated-wave differential curves $(f(V))_{Peak1}$, $(f(V))_{Peak2}$, $(f(V))_{Peak3}$, and $(f(V))_{Peak4}$ derived from the positive electrode and the negative electrode and constituting the first reference differential curve and the parameters in the functions of the separated-wave differential curves, and changing peak widths, peak heights, and peak positions in the combined first reference differential curve to approach the shape of the first differential characteristic curve of measured data. (a) of FIG. 7 also shows acquiring a difference in the differential value dQ/dV between the measured first differential characteristic curve and the first reference differential curve in the range of the inter-terminal voltage value V of the first differential characteristic curve as an evaluation value A. As shown in (a) of FIG. 7, optimization causing the shape of the first reference differential curve to be similar to the shape of the first differential characteristic curve is performed to minimize the evaluation value A.

In (b) of FIG. 7, the vertical axis represents the differential value dV/dQ and the horizontal axis represents the capacity Q. (b) of FIG. 7 shows converting the first reference differential curve into a second reference differential curve and acquiring a difference in the differential value dV/dQ between the measured second differential characteristic curve and the second reference differential curve in the range of the capacity Q of the second differential characteristic curve as an evaluation value B. As shown in (b) of FIG. 7, optimization causing the shape of the second reference differential curve to be similar to the shape of the second differential characteristic curve is performed to minimize the evaluation value B. Then, the fitting process ends at a time point at which the shape of the second differential characteristic curve is most similar to the shape of the second reference differential curve, and the first reference differential curve at a time point of ending is updated and is used as the first reference differential curve reflecting an influence of deterioration of the battery.

Referring to FIG. 6 again, the fitting processing unit 15 corrects the first reference differential curve and the second reference differential curve stored in the characteristic data storage unit 19-1 using the first differential characteristic curve and the second differential characteristic curve which are the measured differential characteristic curves.

The fitting processing unit 15 performs a process of changing the parameters of the functions indicating the separated-wave differential curves derived from the positive electrode and the negative electrode based on the separated wave model and refitting the reference differential curves (the first reference differential curve and the second reference differential curve) combined from the separated-wave differential curves using the first differential characteristic curve and the second differential characteristic curve which are newly measured.

For example, three processes of a first refitting process, a second refitting process, and a third refitting process described below are performed as a reconstruction process.

(A) First Refitting Process

The fitting processing unit 15 calculates the maximum capacity $Q_{max}$ at a time of the deteriorated cell using the measured first differential characteristic curve of the deteriorated cell. The fitting processing unit 15 divides the maximum capacity $Q_{max}$ by the initial maximum capacity $Q_{ini}$ read from the characteristic data storage unit 19-1 and acquires the coefficient P as the division result.

The fitting processing unit 15 changes the coefficients k1, k2, k3, and k4 of the separated-wave differential curves $(f(V))_{Peak1}$, $(f(V))_{Peak2}$, $(f(V))_{Peak3}$, and $(f(V))_{Peak4}$ derived from the positive electrode and the negative electrode in the first reference differential curve and the parameters in the functions of the separated-wave differential curves, and adjusts peak positions, peak widths, and peak heights (differential values dQ/dV) to correspond to the shape of the measured first differential characteristic curve. Accordingly, the fitting processing unit 15 changes the shapes of the separated-wave differential curves $(f(V))_{Peak1}$, $(f(V))_{Peak2}$, $(f(V))_{Peak3}$, and $(f(V))_{Peak4}$ derived from the positive electrode and the negative electrode in the first reference differential curve. Here, the fitting processing unit 15 changes coefficients (P×k1, P×k2, P×k3, and P×k4) of the separated-wave differential curves $(f(V))_{Peak1}$, $(f(V))_{Peak2}$, $(f(V))_{Peak3}$, and $(f(V))_{Peak4}$ derived from the positive electrode and the negative electrode to minimize the evaluation value A (or the sum of squares of differences) obtained by adding an absolute value of a difference of each corresponding voltage value V of the first differential characteristic curve (measured area) and the first reference differential curve.

Then, the fitting processing unit 15 combines the separated-wave differential curves $(f(V))_{Peak1}$, $(f(V))_{Peak2}$, $(f(V))_{Peak3}$, and $(f(V))_{Peak4}$ in which the coefficients (P×k1, P×k2, P×k3, and P×k4) and the parameters in the functions of the separated-wave differential curves are changed, and generates a new first reference differential curve. The fitting processing unit 15 generates the second reference differential curve from the generated new first reference differential curve.

Then, the fitting processing unit 15 acquires the evaluation value B which is the sum of squares of differences in the differential value dV/dQ at the same capacity between the second differential characteristic curve as a measured part and the second reference differential curve.

Here, until the evaluation value B, which is the sum of squares of differences in the differential value dV/dQ between the second differential characteristic curve and the second reference differential curve in a range corresponding to the capacity Q of the second differential characteristic curve, is minimized, the fitting processing unit 15 repeatedly performs the process of changing the coefficients P×k1, P×k2, P×k3, and P×k4 of the separated-wave differential curves $(f(V))_{Peak1}$, $(f(V))_{Peak2}$, $(f(V))_{Peak3}$, and $(f(V))_{Peak4}$ constituting the first reference differential curve and the parameters in the functions of the separated-wave differential curves, and generating a new first reference differential curve.

Then, the fitting processing unit 15 ends the process of reconstructing the first reference differential curve and the second reference differential curve when the evaluation value B in the second differential characteristic curve and the second reference differential curve in the range of the capacity Q of the second differential characteristic curve and the evaluation value A in the first differential characteristic curve and the first reference differential curve in the range of the capacity Q of the first differential characteristic curve are minimized.

Then, the fitting processing unit 15 adds the coefficients P×k1, P×k2, P×k3, and P×k4 of the separated-wave differential curves $(f(V))_{Peak1}$, $(f(V))_{Peak2}$, $(f(V))_{Peak3}$, and $(f(V))_{Peak4}$ of the reconstructed first reference differential curve to the existing results D1, D2, D3, and D4 in the graph shown in FIG. 4 to correspond to the newly calculated coefficient P, and plots the addition results as new results D1, D2, D3, and D4. The fitting processing unit 15 generates the regression lines LD1, LD2, LD3, and LD4 with the initial value D0 as a start point in which a square error of distances between the results D1, D2, D3, and D4 and a plurality of points is the smallest. The fitting processing unit 15 calculates the slopes of the generated regression lines LD1, LD2, LD3, and LD4 and sets the calculated slopes as new coefficients k1, k2, k3, and k4. Then, the fitting processing unit 15 overwrites the coefficients k1, k2, k3, and k4 stored in the characteristic data storage unit 19-1 with the newly calculated coefficients k1, k2, k3, and k4 to update the coefficients k1, k2, k3, and k4.

(B) Second Refitting Process

As another reconstruction algorithm, a process of refitting the first reference differential curve and the second reference differential curve described below may be performed.

The fitting processing unit 15 moves the second differential characteristic curve in parallel by a variation ΔQ of the capacity Q preset for the horizontal axis so as to decrease the above-mentioned evaluation value B. As a result, values of the capacities Q corresponding to the differential values in the area of the second differential characteristic curve are changed.

Then, the fitting processing unit 15 calculates the evaluation value B which is the sum of squares of differences in the differential value dV/dQ at the same capacities Q between the second differential characteristic curve which has been moved in parallel and the second reference differential curve in the area corresponding to the area of the capacity Q of the second differential characteristic curve.

Here, the fitting processing unit 15 detects the position of the capacity Q at which the evaluation value B is minimized while moving the second differential characteristic curve with respect to the horizontal axis. That is, the fitting processing unit 15 performs optimization based on the process of fitting the second differential characteristic curve to the second reference differential curve and detects the range of the capacity Q of the curve shape in the second reference differential curve similar to the curve shape of the second differential characteristic curve.

Thereafter, the fitting processing unit 15 corrects the first reference differential curve and the second reference differential curve stored in the characteristic data storage unit 19-1 using the first differential characteristic curve and the second differential characteristic curve, respectively.

The fitting processing unit 15 changes the coefficients P×k1, P×k2, P×k3, and P×k4 of the separated-wave differential curves $(f(V))_{Peak1}$, $(f(V))_{Peak2}$, $(f(V))_{Peak3}$, and $(f(V))_{Peak4}$ constituting the first reference differential curve and the parameters in the functions of the separated-wave differential curves, and reconstructs the reference differential curves (the first reference differential curve and the second reference differential curve) combined from the separated-wave differential curves.

As described above, at a time of reconstructing the reference differential curves, the fitting processing unit 15 changes the coefficients P×k1, P×k2, P×k3, and P×k4 of the separated-wave differential curves $(f(V))_{Peak1}$, $(f(V))_{Peak2}$, $(f(V))_{Peak3}$, and $(f(V))_{Peak4}$ in the first reference differential curve and the parameters in the functions of the separated-wave differential curves, and adjusts the peak positions, the peak widths, and the peak heights (the differential value dQ/dV) of the separated-wave differential curves to change the shape of the reference differential curve. Here, the fitting processing unit 15 changes the coefficients P×k1, P×k2, P×k3, and P×k4 of the separated-wave differential curves $(f(V))_{Peak1}$, $(f(V))_{Peak2}$, $(f(V))_{Peak3}$, and $(f(V))_{Peak4}$ and the parameters in the functions of the separated-wave differential curves so as to minimize the evaluation value (or the sum of squares of differences) obtained by adding the absolute values of the differences in the corresponding voltage value V between the first differential characteristic curve (a measured area) and the first reference differential curve.

Then, the fitting processing unit 15 combines the changed separated-wave differential curves $(f(V))_{Peak1}$, $(f(V))_{Peak2}$, $(f(V))_{Peak3}$, and $(f(V))_{Peak4}$ to generate a new first reference differential curve. The fitting processing unit 15 generates the second reference differential curve from the generated new first reference differential curve. The fitting processing unit 15 acquires the evaluation value B in the second differential characteristic curve, in which a numerical value of the capacity Q is optimized by parallel movement, and the second reference differential curve.

Here, the fitting processing unit 15 repeatedly performs the process of changing the coefficients P×k1, P×k2, P×k3, and P×k4 of the separated-wave differential curves $(f(V))_{Peak1}$, $(f(V))_{Peak2}$, $(f(V))_{Peak3}$, and $(f(V))_{Peak4}$ and the parameters in the functions of the separated-wave differential curves to generate a new first reference differential curve so as to minimize the evaluation value B in the second differential characteristic curve and the second reference differential curve in the range of the capacity Q of the second differential characteristic curve. Then, the fitting processing unit 15 ends the process of reconstructing the first reference differential curve when the evaluation value B in the second differential characteristic curve and the second reference differential curve in the range of the capacity Q of the second differential characteristic curve and the evaluation value A in the first differential characteristic curve and the first reference differential curve in the range of the capacity Q of the first differential characteristic curve are minimized.

Similarly to the first refitting process, the fitting processing unit 15 adds the coefficients P×k1, P×k2, P×k3, and P×k4 of the separated-wave differential curves $(f(V))_{Peak1}$, $(f(V))_{Peak2}$, $(f(V))_{Peak3}$, and $(f(V))_{Peak4}$ of the reconstructed first reference differential curve to the existing results D1, D2, D3, and D4 in the graph shown in FIG. 4 to correspond to the newly calculated coefficient P and plots the addition results as new results D1, D2, D3, and D4. The fitting processing unit 15 calculates the slopes of the generated regression lines LD1, LD2, LD3, and LD4 and sets the calculated slopes as new coefficients k1, k2, k3, and k4. Then, the fitting processing unit 15 overwrites the coefficients k1, k2, k3, and k4 stored in the characteristic data storage unit 19-1 with the newly calculated coefficients k1, k2, k3, and k4 to update the coefficients k1, k2, k3, and k4.

(C) Third Refitting Process

As another reconstruction algorithm, a process of reconstructing the first reference differential curve and the second reference differential curve described below may be performed.

Until the evaluation value A, which is the sum of squares of differences in the differential value dQ/dV between the first differential characteristic curve and the first reference differential curve in the range corresponding to the voltage value V of the first differential characteristic curve, is minimized, the fitting processing unit 15 changes the coefficients P×k1, P×k2, P×k3, and P×k4 of the separated-wave differential curves $(f(V))_{Peak1}$, $(f(V))_{Peak2}$, $(f(V))_{Peak3}$, and $(f(V))_{Peak4}$ and the parameters in the functions of the separated-wave differential curves. The data converting unit 13 repeatedly performs a process of adjusting peak positions, peak widths, and peak heights (the differential value dQ/dV) of the separated-wave differential curves $(f(V))_{Peak1}$, $(f(V))_{Peak2}$, $(f(V))_{Peak3}$, and $(f(V))_{Peak4}$ to generate a new first reference differential curve.

Then, the fitting processing unit 15 converts the newly calculated first reference differential curve into a second reference differential curve to acquire a new second reference differential curve.

Similarly to the second refitting process, the fitting processing unit 15 adds the coefficients P×k1, P×k2, P×k3, and P×k4 of the separated-wave differential curves $(f(V))_{Peak1}$, $(f(V))_{Peak2}$, $(f(V))_{Peak3}$, and $(f(V))_{Peak4}$ of the reconstructed first reference differential curve to existing results D1, D2, D3, and D4 in the graph shown in FIG. 4 to correspond to the newly calculated coefficient P and plots the addition results as new results D1, D2, D3, and D4. The fitting processing unit 15 calculates the slopes of the generated regression lines LD1, LD2, LD3, and LD4 and sets the calculated slopes as new coefficients k1, k2, k3, and k4. Then, the fitting processing unit 15 overwrites the coefficients k1, k2, k3, and k4 stored in the characteristic data storage unit 19-1 with the newly calculated coefficients k1, k2, k3, and k4 to update the coefficients k1, k2, k3, and k4.

Referring to FIG. 6 again, the maximum capacity calculating unit 16 estimates the maximum capacity of a cell (hereinafter, referred to as a non-selected cell) other than the cell (the deteriorated cell) used to identify the coefficients k1, k2, k3, and k4. That is, the maximum capacity calculating unit 16 performs fitting on a partially measured differential characteristic curve which is a measured differential characteristic curve measured in the range of the inter-terminal voltage measured from the non-selected cell using the coefficients k1, k2, k3, and k4 read from the measured data storage unit 19-2, and calculates the coefficient P. That is, in this embodiment, the coefficient P, which is a ratio to the initial maximum capacity with the initial maximum capacity of the deteriorated cell as a reference as described above, and the maximum capacity of the non-selected cell is estimated using the generated first reference differential curve of the non-selected cell.

FIG. 8 is a diagram showing estimation of a maximum capacity value of a non-selected cell using the coefficients k1, k2, k3, and k4 acquired in a deteriorated cell. (a) of FIG. 8 shows a first reference differential curve indicating a correspondence between the differential value dQ/dV and the inter-terminal voltage value V, in which the vertical axis represents the differential value dQ/dV and the horizontal axis represents the inter-terminal voltage value V. A voltage range VR indicates a defined range of a voltage value V1 and a voltage value V2, that is, a range of a voltage in which a first partial differential characteristic curve which is a local first differential characteristic curve acquired from the capacity and the inter-terminal voltage value V of a non-selected cell of which the maximum capacity will be estimated is acquired. Here, a process of charging the non-selected cell ends at a time point at which the inter-terminal voltage of a deteriorated cell of which the maximum capacity decreases becomes an upper-limit voltage.

Accordingly, the first differential characteristic curve of the non-selected cell is a first partial differential characteristic curve in the defined voltage range. That is, the singular points R1, R2, and R3 are not included in the voltage range VR of the first partial differential characteristic curve, and the coefficients P×k1, P×k2, P×k3, and P×k4 of the separated-wave differential curves $(f(V))_{Peak1}$, $(f(V))_{Peak2}$, $(f(V))_{Peak3}$, and $(f(V))_{Peak4}$ cannot be calculated by fitting the first reference differential curve to the first partial differential characteristic curve. Accordingly, in this embodiment, the coefficients k1, k2, k3, and k4 of the deteriorated cell are used as the coefficients k1, k2, k3, and k4 of the separated-wave differential curves in the first reference differential curve of the non-selected cell.

(b) of FIG. 8 shows a differential curve indicating a correspondence between the differential value dQ/dV and the capacity Q, in which the vertical axis represents the differential value dQ/dV and the horizontal axis represents the capacity Q. As described above, since the process of charging the non-selected cell ends at the time point at which the inter-terminal voltage of the deteriorated cell becomes the upper-limit voltage, the capacity of the non-selected cell is not sufficiently filled. Accordingly, the partial differential curve shown in (c) of FIG. 8 is a differential curve of a defined part of a capacity range QR.

(c) of FIG. 8 shows a second reference differential curve indicating a correspondence between the differential value dV/dQ and the inter-terminal voltage value V, in which the vertical axis represents the differential value dV/dQ and the horizontal axis represents the inter-terminal voltage value V. In (c) of FIG. 8, similarly, since the process of charging the non-selected cell ends at the time point at which the inter-terminal voltage of the deteriorated cell becomes the upper-limit voltage, the capacity of the non-selected cell is not sufficiently filled. Accordingly, the second partial differential characteristic curve shown in (c) of FIG. 8 is a second measured differential characteristic curve of a defined part of the capacity range QR.

This embodiment is based on the premise that all of the cells constituting the secondary battery employ the same type of lithium batteries. Accordingly, the separated-wave differential curves constituting the first reference differential curve corresponding to a non-selected cell are the same as the separated-wave differential curves $(f(V))_{Peak1}$, $(f(V))_{Peak2}$, $(f(V))_{Peak3}$, and $(f(V))_{Peak4}$ which are combined to generate the first reference differential curve of the deteriorated cell.

Accordingly, the maximum capacity calculating unit 16 substitutes the coefficients k1, k2, k3, and k4 read from the characteristic data storage unit 19-1 into Equation (1) as shown in (c) of FIG. 8. For example, in (a) of FIG. 8, k1=1.25, k2=1.10, k3=0.8, and k=0.75 are set and Equation (1) is changed to Equation (3).

$$f(V)=P\{1.25 \cdot (f(V))_{Peak1}+1.10 \cdot (f(V))_{Peak2}+0.80 \cdot (f(V))_{Peak3}+0.75 \cdot (f(V))_{Peak4}\} \quad (3)$$

Referring to FIG. 6 again, at a time of estimating the maximum capacity of a non-selected cell, the maximum capacity calculating unit 16 performs fitting using the first reference differential curve and the first partial differential characteristic curve in Equation (3), and calculates the coefficient P in the first reference differential curve. Similarly, the maximum capacity calculating unit 16 performs the fitting process using the second reference differential curve which is generated by converting the first reference differential curve of Equation (3) and the second partial differential characteristic curve. At this time, the maximum capacity calculating unit 16 performs the fitting process using the first partial differential characteristic curve including a data group in a predetermined time range of the data set indicating a correspondence between the differential value dQ/dV and the voltage value V of a non-selected cell, which has been read from the measured data storage unit 19-2, and the second partial differential characteristic curve including a data group in a predetermined time range of the data set indicating a correspondence between the differential value dV/dQ and the capacity Q.

The fitting process which is performed by the maximum capacity calculating unit 16 is the same as the refitting process which is performed by the fitting processing unit 15, except that the fitting is performed in only defined parts of the voltage range and the capacity range. At this time, the fitting process is performed by fixing the coefficients k1, k2, k3, and k4 of the separated-wave differential curves in the first reference differential curve of a non-selected cell and adjusting the coefficient P.

Then, the maximum capacity calculating unit 16 multiplies the initial maximum capacity $Q_{ini}$ read from the characteristic data storage unit 19-1 by the coefficient P when the process of fitting the second partial measured differential characteristic curve in Equation (3) ends and sets the multiplication result as the maximum capacity $Q_{max}$ of the non-selected cell to be estimated. The maximum capacity calculating unit 16 correlates the calculated maximum capacity with the non-selected cell and writes and stores the maximum capacity to and in the estimated value storage unit 19-3.

As described above, the secondary battery capacity measuring system according to this embodiment measures the capacity Q and the inter-terminal voltage value V of a deteriorated cell, generates the first measured differential characteristic curve and the second measured differential characteristic curve, performs the process of fitting the first reference differential curve and the second reference differential curve, and calculates the coefficients k1, k2, k3, and k4 of the separated-wave differential curves $(f(V))_{Peak1}$, $(f(V))_{Peak2}$, $(f(V))_{Peak3}$, and $(f(V))_{Peak4}$ constituting the first reference differential curve. The secondary battery capacity measuring system calculates the coefficient P indicating a ratio of deterioration in the first reference differential curve of a non-selected cell to be estimated using the coefficients k1, k2, k3, and k4, multiplies the initial maximum capacity $Q_{ini}$ of the deteriorated cell by the coefficient P, and estimates the maximum capacity $Q_{max}$ of the non-selected cell to be estimated.

Accordingly, in the secondary battery capacity measuring system according to this embodiment, the maximum capacity $Q_{max}$ of a non-selected cell which cannot be actually measured because a charging process stops in the middle way due to a deteriorated cell can be easily estimated using the initial maximum capacity $Q_{ini}$ calculated from the measured values of the deteriorated cell and the coefficients k1, k2, k3, and k4 of the separated-wave differential curves $(f(V))_{Peak1}$, $(f(V))_{Peak2}$, $(f(V))_{Peak3}$, and $(f(V))_{Peak4}$ constituting the first reference differential curve corresponding to the deteriorated cell.

Figure 9:
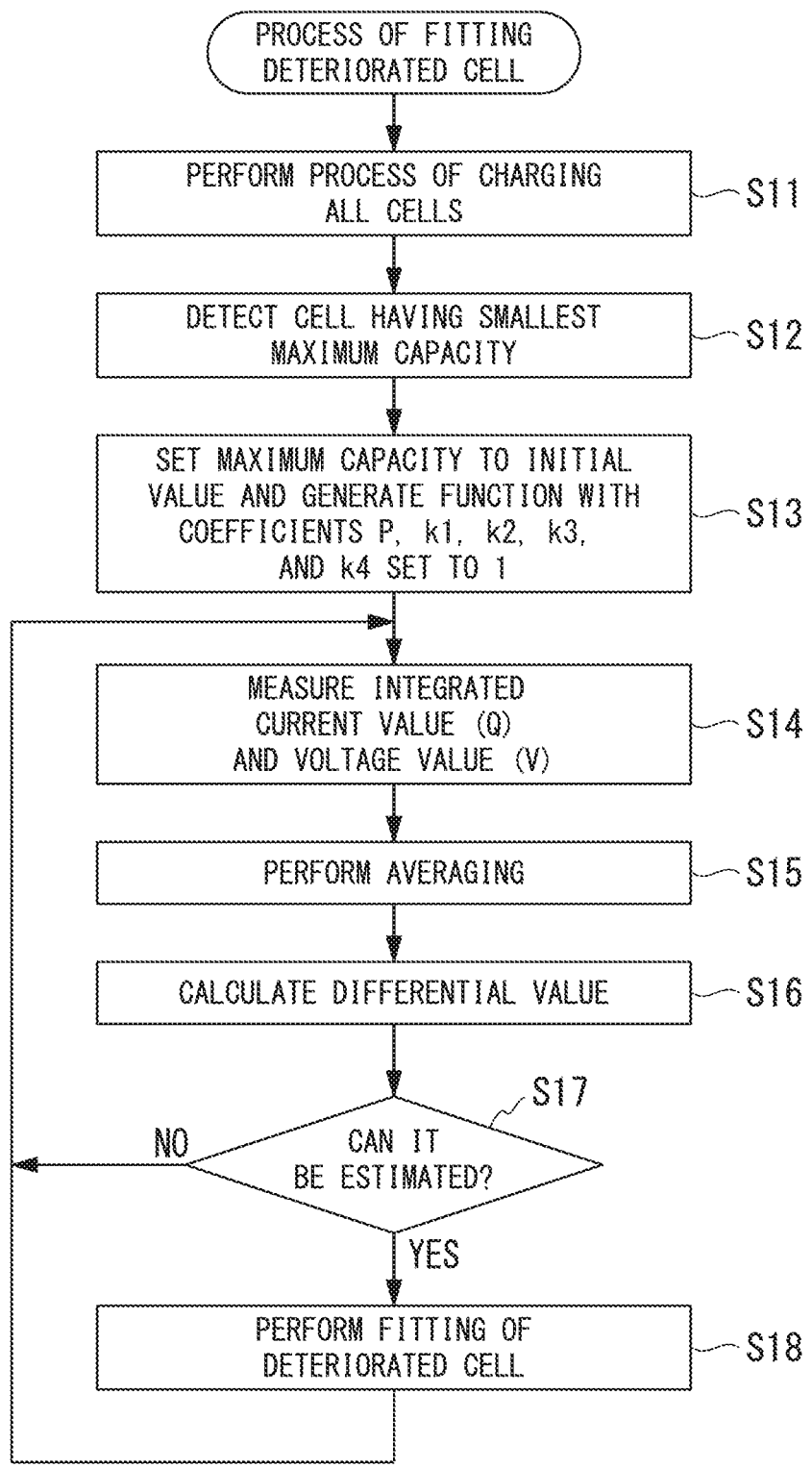
FIG. 9 is a flowchart showing an example of a process flow of fitting a first reference differential curve indicating characteristics of a deteriorated cell.

FIG. 9 is a flowchart showing an example of a process flow of fitting a first reference differential curve indicating characteristics of a deteriorated cell.

Step S11:

The battery control system 4 performs a process of charging the battery module 2 as a secondary battery while monitoring the current value and the inter-terminal voltage value V which are measured by the current sensor 21 and the voltage sensor 3 and supplied from the secondary battery capacity measuring system 1.

Step S12:

The battery control system 4 determines whether the inter-terminal voltage value V of each cell which is supplied from the secondary battery capacity measuring system 1 is higher than an upper-limit voltage. When the inter-terminal voltage value V of a certain cell 22 is higher than the upper-limit voltage, the battery control system 4 stops the process of charging the battery module 2.

Then, the fitting processing unit 15 detects whether the inter-terminal voltage value V of a certain cell 22 in the battery module 2 is higher than the upper-limit voltage. Here, the fitting processing unit 15 determines that the cell 22 of which the inter-terminal voltage value is higher than the upper-limit voltage is a cell 22 having the smallest maximum capacity, that is, a deteriorated cell, in the battery module 2.

Step S13:

The fitting processing unit 15 sets the maximum capacity $Q_{max}$ of the deteriorated cell in the first charging as the initial maximum capacity $Q_{ini}$ and writes and stores the initial maximum capacity to and in the characteristic data storage unit 19-1. The fitting processing unit 15 sets the coefficient P in Equation (1) of the first reference differential curve indicating characteristics of the deteriorated cell to "1", sets the coefficients k1, k2, k3, and k4 of the separated-wave differential curves $(f(V))_{Peak1}$, $(f(V))_{Peak2}$, $(f(V))_{Peak3}$, and $(f(V))_{Peak4}$ constituting the first reference differential curve, and writes and stores the set values to and in the characteristic data storage unit 19-1.

Step S14:

The A/D converting unit 11 samples the current value I (a charging current value applied to the battery module 2) output from the current sensor 21 and the inter-terminal voltage value V of the cell 22 output from the voltage sensor 3 and converts the sampled values from analog data to digital data.

Here, the A/D converting unit 11 converts all sets of the current value I and the inter-terminal voltage value V of the cells 22 in the battery module 2 from analog data to digital data.

Step S15:

The average processing unit 12 averages the current values I and the inter-terminal voltage values V in a predetermined time range for each data of the cells 22 in the battery module 2, thereby reducing the number of pieces of data.

The average processing unit 12 integrates the current value I from the time data for each data of the cells 22 in the battery module 2, thereby calculating the capacity Q which varies in the predetermined time range.

Step S16:

The data converting unit 13 calculates a differential value dQ/dV obtained by differentiating the capacity Q using a differential operator d/dV and a differential value dV/dQ obtained by differentiating the voltage value V using a differential operator d/dQ.

Then, the data converting unit 13 outputs a data set of the voltage value V, the current value I, the capacity Q, the differential value dQ/dV, and the differential value dV/dQ to the input/output unit 14 in a time series.

The control unit 17 writes and stores the data set of the voltage value V, the current value I, the capacity Q, the differential value dQ/dV, and the differential value dV/dQ supplied to the input/output unit 14 to and in the measured data storage unit 19-2 in a time series to correspond to the cells 22 of the battery module 2 (storage of data).

Step S17:

The control unit 17 determines whether a number of sets of the voltage value V and the current value I which can change the first reference differential curve indicating characteristics of a deteriorated cell are measured, that is, whether the maximum capacity $Q_{max}$ of the deteriorated cell is acquired (whether the singular points are included in the measured part), with reference to the measured data storage unit 19-2.

When the maximum capacity $Q_{max}$ of the deteriorated cell is acquired, the control unit 17 notifies the fitting processing unit 15 of a control signal indicating that the fitting process is possible and performs the process of Step S18.

On the other hand, when the maximum capacity $Q_{max}$ of the deteriorated cell is not acquired, the control unit 17 performs the process of Step S14.

Step S18:

As described above, the fitting processing unit 15 generates the first measured differential characteristic curve and the second measured differential characteristic curve with reference to the measured data storage unit 19-2 and performs the process of fitting the first reference differential curve and the second reference differential curve.

At this time, the fitting processing unit 15 divides the maximum capacity $Q_{max}$ at that time by the initial maximum capacity $Q_{ini}$ read from the characteristic data storage unit 19-1 and sets the division result as the value of the coefficient P. The fitting processing unit 15 the coefficients k1, k2, k3, and k4 of the fitted separated-wave differential curves $(f(V))_{Peak1}$, $(f(V))_{Peak2}$, $(f(V))_{Peak3}$, and $(f(V))_{Peak4}$ on the graph shown in FIG. 4 to correspond to the calculated coefficient P, calculates the coefficients k1, k2, k3, and k4 as the slopes of the regression lines, and overwrites the coefficients k1, k2, k3, and k4 in the characteristic data storage unit 19-1 with the calculated coefficients k1, k2, k3, and k4 to update the coefficients.

Figure 10:
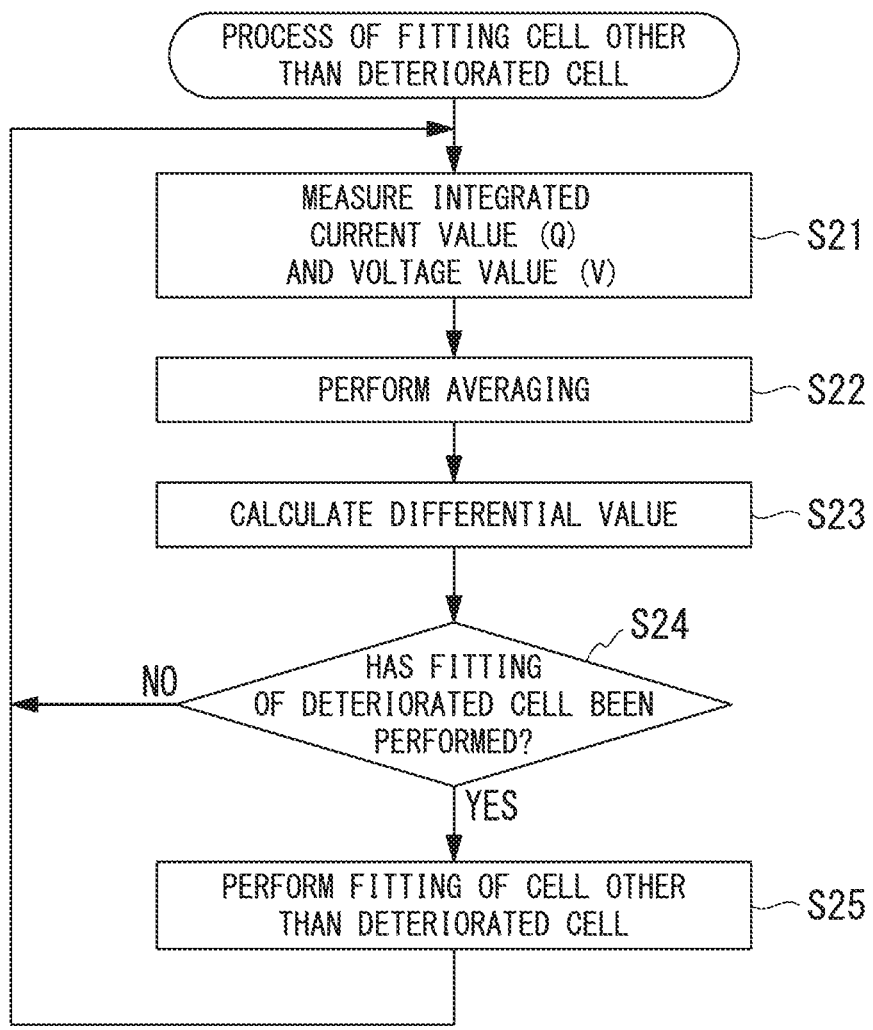
FIG. 10 is a diagram showing a process of calculating a maximum capacity $Q_{max}$ of a non-selected cell using coefficients k1, k2, k3, and k4 of a deteriorated cell.

FIG. 10 is a diagram showing a process of calculating a maximum capacity $Q_{max}$ of a non-selected cell using coefficients k1, k2, k3, and k4 of a deteriorated cell.

Step S21:

The A/D converting unit 11 samples measured data of a non-selected cell other than the deteriorated cell in the battery module 2, that is, the current value I (the charging current value of the battery module 2) output from the current sensor 21 and the inter-terminal voltage value V of the cell 22 output from the voltage sensor 3, and converts the sampled values from analog data to digital data.

Here, the A/D converting unit 11 converts all the sets of the current value I and the inter-terminal voltage value V of the non-selected cells other than the deteriorated cell in the battery module 2 from analog data to digital data.

Step S22:

The average processing unit 12 averages the current values I and the inter-terminal voltage values in a predetermined time range in all data of the non-selected cells other than the deteriorated cell in the battery module 2 to reduce the number of pieces of data.

The average processing unit 12 integrates the current value I from the time data in all data of the non-selected cells other than the deteriorated cell in the battery module 2 to calculate the capacity Q which varies in the predetermined time range.

Step S23:

The data converting unit 13 calculates the differential value dQ/dV obtained by differentiating the capacity Q using the differential operator d/dV and the differential value dV/dQ obtained by differentiating the voltage value V using the differential operator d/dQ.

Then, the data converting unit 13 outputs the data set of the voltage value V, the current value I, the capacity Q, the differential value dQ/dV, and the differential value dV/dQ to the input/output unit 14 in a time series.

The control unit 17 writes and stores the data set of the voltage value V, the current value I, the capacity Q, the differential value dQ/dV, and the differential value dV/dQ which is supplied to the input/output unit 14 to and in the measured data storage unit 19-2 in a time series (storage of data) for each non-selected cell in the battery module 2.

Step S24:

The control unit 17 determines whether the fitting processing unit 15 performs the process of fitting the first reference differential curve for updating the coefficients k1, k2, k3, and k4 with reference to the measured data storage unit 19-2. At this time, the control unit 17 determines whether the process of fitting the first reference differential curve is performed depending on whether the coefficients k1, k2, k3, and k4 stored in the measured data storage unit 19-2 are updated.

Then, when it is determined that the process of fitting the first reference differential curve is performed, the control unit 17 notifies the maximum capacity calculating unit 16 of a control signal indicating that the maximum capacity can be estimated and performs the process of Step S25.

On the other hand, when it is determined that the process of fitting the first reference differential curve is not performed, the control unit 17 performs the process of Step S21.

Step S25:

The maximum capacity calculating unit 16 reads the coefficients k1, k2, k3, and k4 from the characteristic data storage unit 19-1 as described above.

Then, the maximum capacity calculating unit 16 sequentially reads the measured data of the non-deteriorated cells from the measured data storage unit 19-2, generates the first partial differential characteristic curve and the second partial differential characteristic curve, performs the process of fitting the first reference differential curve and the second reference differential curve corresponding to the non-deteriorated cell, and calculates the coefficient P. Accordingly, the maximum capacity calculating unit 16 calculates the maximum capacity $Q_{max}$ of each non-deteriorated cell by multiplying the maximum capacity $Q_{ini}$ read from the characteristic data storage unit 19-1 by the coefficient P of each non-deteriorated cell.

The maximum capacity calculating unit 16 writes and stores the maximum capacity $Q_{max}$ of each non-deteriorated cell to and in the estimated value storage unit 19-3 to correspond to the corresponding non-deteriorated cell.

(Second Embodiment)

In the first embodiment, the coefficients k1, k2, k3, and k4 of the separated-wave differential curves $(f(V))_{Peak1}$, $(f(V))_{Peak2}$, $(f(V))_{Peak3}$, and $(f(V))_{Peak4}$ constituting the first reference differential curve are calculated from on the deteriorated cell. However, in a second embodiment of the present invention, the coefficients k1, k2, k3, and k4 of the separated-wave differential curves $(f(V))_{Peak1}$, $(f(V))_{Peak2}$, $(f(V))_{Peak3}$, and $(f(V))_{Peak4}$ constituting the first reference differential curve are calculated from a plurality of selected cells (hereinafter, referred to as selected cells) including the deteriorated cell.

Figure 11:
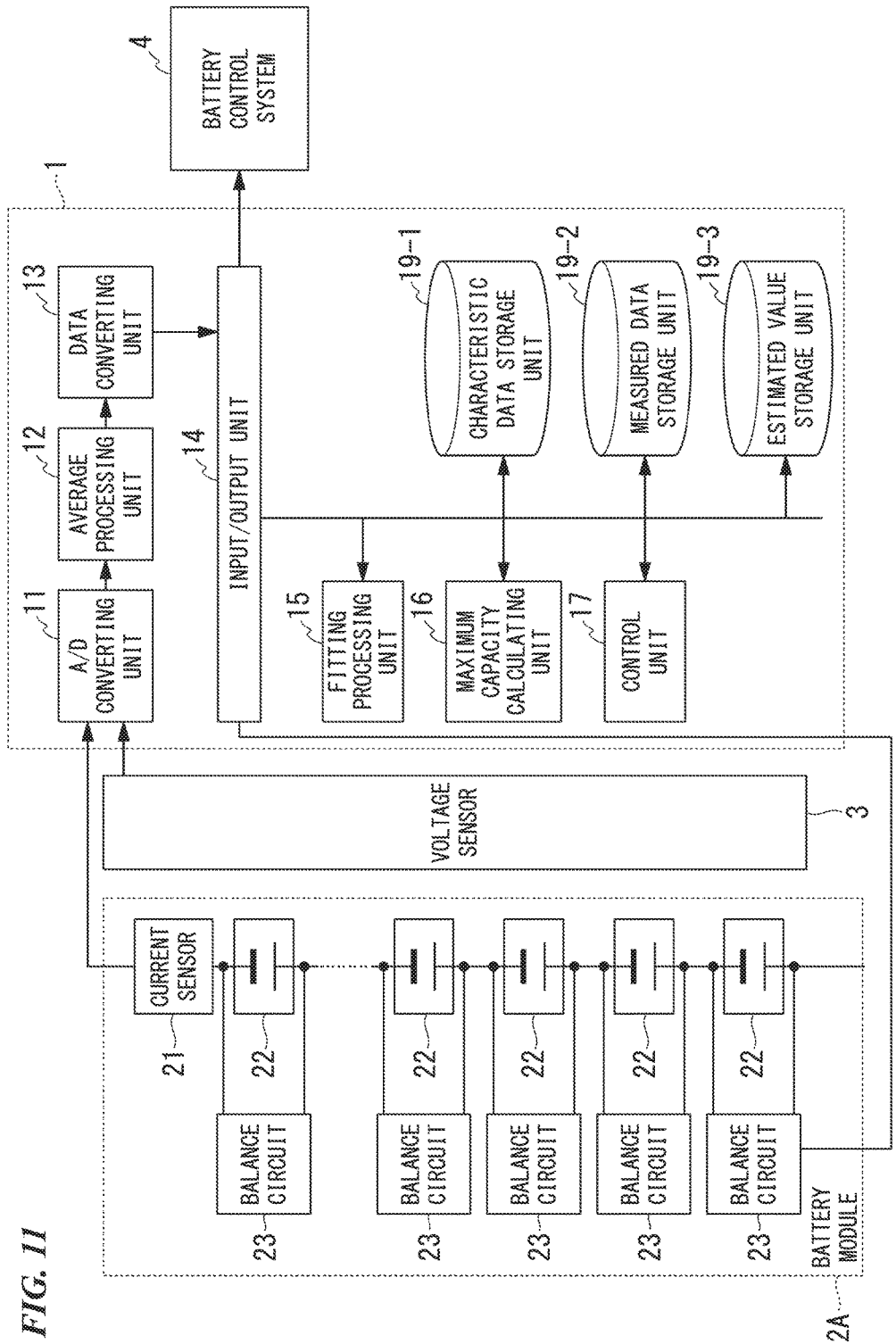
FIG. 11 is a diagram showing an example in which a capacity of a secondary battery is measured using an example of a configuration of a secondary battery capacity measuring system according to a second embodiment of the present invention.

A secondary battery capacity measuring system according to the second embodiment of the present invention will be described below with reference to the drawings. FIG. 11 is a diagram showing an example in which a secondary battery capacity is measured using an example of a configuration of the secondary battery capacity measuring system according to the second embodiment of the present invention. The secondary battery capacity measuring system 1 includes an A/D converting unit 11, an average processing unit 12, a data converting unit 13, an input/output unit 14, a fitting processing unit 15, a maximum capacity calculating unit 16, a control unit 17, a characteristic data storage unit 19-1, a measured data storage unit 19-2, and an estimated value storage unit 19-3. The same elements in the second embodiment as in the first embodiment will be referenced by the same reference signs. Hereinafter, the configuration and the operation of the second embodiment different from those of the first embodiment will be described. A battery module 2 includes a current sensor 21, a plurality of batteries (cells) 22, and a balance circuit 23 that shifts charging start positions (positions on an axis of the capacity Q) of the cells 22 (that temporally shifts the capacity Q to be charged), and supplies power to a load which is not shown.

In the second embodiment, the battery module 2 is provided with the balance circuit 23. The balance circuit 23 is disposed for each cell 22 and controls the balance of capacities with which the cells are charged. For example, in the first charging, the initial maximum capacity $Q_{ini}$ of a deteriorated cell is calculated as described above. Accordingly, by adjusting the capacity value charging the deteriorated cell by bypassing a minute current in the charging current flowing in the deteriorated cell, it is possible to sequentially detect a cell (one or more cells) having a second smallest maximum capacity from the deteriorated cell. Sequentially, a cell having a smaller maximum capacity from the deteriorated cell is set as a selected cell for calculating the coefficients k1, k2, k3, and k4. The maximum capacity $Q_{max}$ of each selected cell is measured by the above-mentioned measurement.

Figure 12:
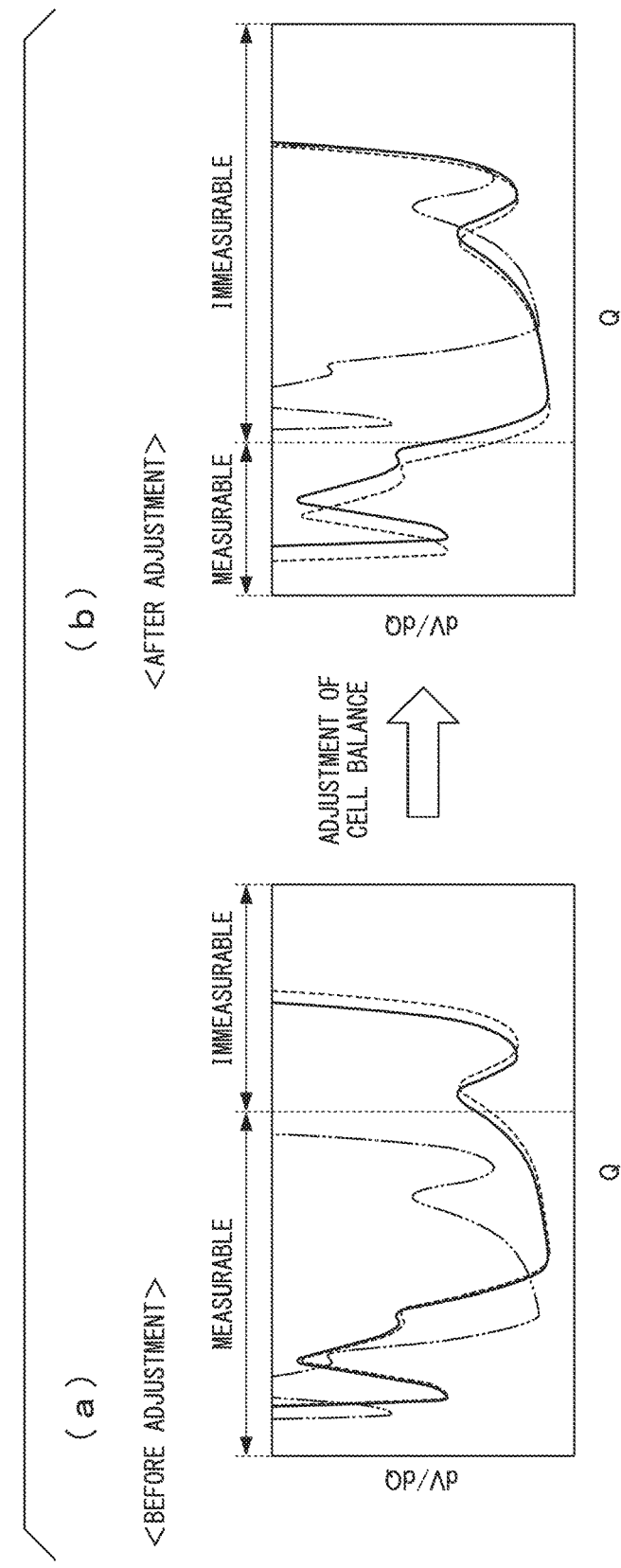
FIG. 12 is a diagram showing acquisition of a correspondence between a differential value dV/dQ which is a differential characteristic of a selected cell and a capacity value Q in a balance circuit.

FIG. 12 is a diagram showing acquisition of a correspondence between a differential value dV/dQ which is a differential characteristic of a selected cell and a capacity value Q in a balance circuit.

(a) of FIG. 12 is a diagram showing that singular points of another selected cell are not included in a measured range because the maximum capacity of the deteriorated cell is smaller than those of the other selected cells.

(b) of FIG. 12 is a diagram showing that the time at which charging of the deteriorated cell is started is shifted and the time at which the charging with the maximum capacity of the deteriorated cell is ended is shifted.

As described above, when acquisition of a correspondence between the differential value dV/dQ which is a differential characteristic of the deteriorated cell and the capacity Q is acquired two times, the range of the capacity Q which could not be measured by the first charging of the selected cell can be supplemented by the second charging by shifting the position of the capacity Q at which the first charging of the deteriorated cell is started, and the differential characteristics including the singular points of each selected cell and the maximum capacity $Q_{max}$ can be acquired.

Referring to FIG. 12 again, through the above-mentioned processes, the fitting processing unit 15 divides the maximum capacities $Q_{max}$ acquired from the selected cells other than the deteriorated cell by the maximum capacity $Q_{ini}$ of the deteriorated cell to calculate the coefficient P at the time of measurement.

Then, the fitting processing unit 15 calculates the coefficients P×k1, P×k2, P×k3, and P×k4 of the selected cells other than the deteriorated cell by the same process as the process of calculating the coefficients P×k1, P×k2, P×k3, and P×k4 of the separated-wave differential curves $(f(V))_{Peak1}$, $(f(V))_{Peak2}$, $(f(V))_{Peak3}$, and $(f(V))_{Peak4}$ in the deteriorated cell described above in the first embodiment.

Then, the fitting processing unit 15 divides the maximum capacities $Q_{max}$ of the selected cells at the time of measurement by the initial maximum capacity $Q_{ini}$ of the deteriorated cell to calculated the coefficient P.

The fitting processing unit 15 groups the coefficient P and the coefficients P×k1, P×k2, P×k3, and P×k4 into sets and plots the grouped sets on the graph shown in FIG. 4 along with the sets of the coefficient P and the coefficients P×k1, P×k2, P×k3, and P×k4 which are calculated in the deteriorated cell.

Then, the fitting processing unit 15 calculates slopes of regression lines LD1, LD2, LD3, and LD4 by the sets (D1, D2, D3, and D4) of the coefficient P and the coefficients P×k1, P×k2, P×k3, and P×k4 in a plurality of selected cells including the deteriorated cell.

The fitting processing unit 15 sets the slopes of the regression lines LD1, LD2, LD3, and LD4 to the coefficients k1, k2, k3, and k4 and writes the slopes to the characteristic data storage unit 19-1 to perform an updating process.

Figure 13:
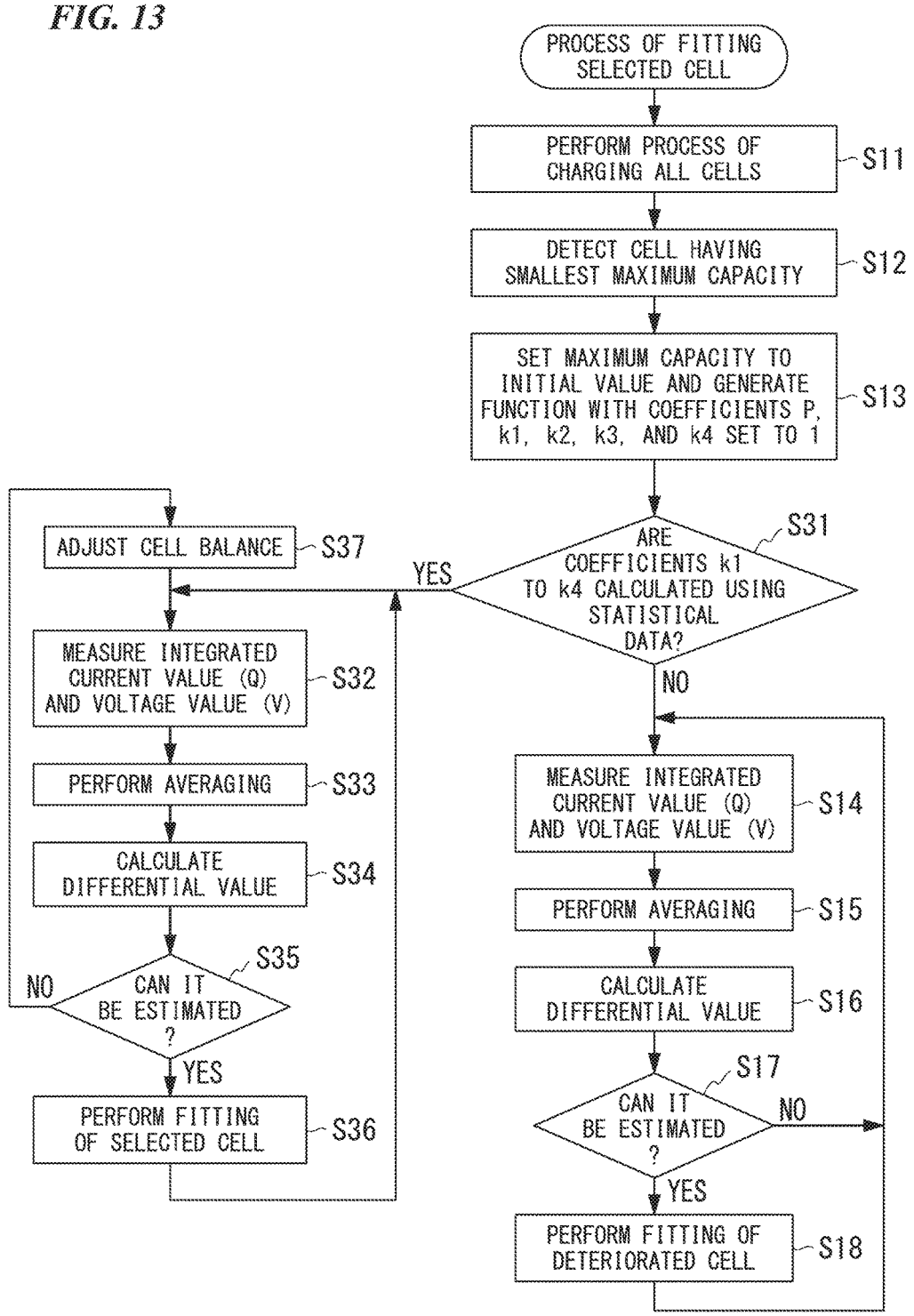
FIG. 13 is a flowchart showing an example of a process flow of fitting first reference differential curves indicating characteristics of selected cells including a deteriorated cell.

FIG. 13 is a flowchart showing an example of a process flow of fitting first reference differential curves indicating characteristics of selected cells including a deteriorated cell.

In the flowchart shown in FIG. 13, Steps S11 to S18 are the same as Steps S11 to S18 in the flowchart shown in FIG. 9. Hereinafter, processes of Steps S31 to S37, which are different from those in the first embodiment, will be described.

Step S31:

The fitting processing unit 15 inputs a calculation control signal indicating whether a method using statistical data supplied via the input/output unit 14 (a method of calculating the coefficients k1, k2, k3, and k4 using a plurality of selected cells) is used to calculate the coefficients k1, k2, k3, and k4 in Equation (1).

Then, when the calculation control signal indicates that the method using statistical data is used to calculate the coefficients k1, k2, k3, and k4, the fitting processing unit 15 performs the process of Step S32. On the other hand, when the calculation control signal does not indicate that the method using statistical data is used to calculate the coefficients k1, k2, k3, and k4, that is, when only the deteriorated cell is used to calculate the coefficients k1, k2, k3, and k4 similarly to the first embodiment, the fitting processing unit 15 performs the process of Step S32.

Step S32:

The A/D converting unit 11 samples the current value I (a charging current value applied to the battery module 2) output from the current sensor 21 and the inter-terminal voltage value V of the cell 22 output from the voltage sensor 3 and converts the sampled values from analog data to digital data.

Here, the A/D converting unit 11 converts all sets of the current value I and the inter-terminal voltage value V of the cells 22 in the battery module 2 from analog data to digital data.

Step S33:

The average processing unit 12 averages the current values I and the inter-terminal voltage values V in a predetermined time range in the data of the cells 22 in the battery module 2, thereby reducing the number of pieces of data.

The average processing unit 12 integrates the current value I from the time data in the data of the cells 22 in the battery module 2, thereby calculating the capacity Q which varies in the predetermined time range.

Step S34:

The data converting unit 13 calculates a differential value dQ/dV obtained by differentiating the capacity Q using the differential operator d/dV and a differential value dV/dQ obtained by differentiating the voltage value V using the differential operator d/dQ.

Then, the data converting unit 13 outputs a data set of the voltage value V, the current value I, the capacity Q, the differential value dQ/dV, and the differential value dV/dQ to the input/output unit 14 in a time series.

The control unit 17 writes and stores the data set of the voltage value V, the current value I, the capacity Q, the differential value dQ/dV, and the differential value dV/dQ supplied to the input/output unit 14 to and in the measured data storage unit 19-2 in a time series to correspond to the cells 22 of the battery module 2 (storage of data).

Step S35:

The control unit 17 determines whether a number of sets of the voltage value V and the current value I which can change the first reference differential curve indicating characteristics of the selected cells including the deteriorated cell are measured, that is, whether the maximum capacity $Q_{max}$ of the deteriorated cell is acquired (whether the singular points are included in the measured part), with reference to the measured data storage unit 19-2.

When the maximum capacities $Q_{max}$ of all the selected cells including the deteriorated cell are acquired, the control unit 17 notifies the fitting processing unit 15 of a control signal indicating that the fitting process is possible and performs the process of Step S36.

On the other hand, when the maximum capacity $Q_{max}$ of the deteriorated cell is acquired, the maximum capacity $Q_{max}$ of a selected cell is acquired, and the time at which the deteriorated cell is charged is not shifted by the balance circuit 23, the control unit 17 performs the process of Step S37.

When the maximum capacity of the deteriorated cell is not acquired or when the balance circuit 23 shifts the time and the maximum capacity $Q_{max}$ of a selected is not acquired, the control unit 17 performs the process of Step S32.

Step S36:

The fitting processing unit 15 generates the first measured differential characteristic curve and the second measured differential characteristic curve of ach selected cell including the deteriorated cell with reference to the measured data storage unit 19-2 and performs the process of fitting the first reference differential curve and the second reference differential curve.

At this time, the fitting processing unit 15 divides the maximum capacity $Q_{max}$ of each selected cell including the deteriorated cell at that time by the maximum capacity $Q_{ini}$ read from the characteristic data storage unit 19-1.

Then, the fitting processing unit 15 sets the division results as the values of the coefficients P of the selected cells including the deteriorated cell. The fitting processing unit 15 plots the coefficients P×k1, P×k2, P×k3, and P×k4 of the fitted separated-wave differential curves $(f(V))_{Peak1}$, $(f(V))_{Peak2}$, $(f(V))_{Peak3}$, and $(f(V))_{Peak4}$ of the selected cells including the deteriorated cell on the graph shown in FIG. 4 to correspond to the calculated coefficient P, calculates the coefficients k1, k2, k3, and k4 as the slopes of the corresponding regression lines, and overwrites the coefficients k1, k2, k3, and k4 in the characteristic data storage unit 19-1 therewith to update the coefficients.

Step S37:

The control unit 17 controls the balance circuit 23 corresponding to the deteriorated cell via the input/output unit 14 and performs a process of shifting the position of the capacity Q at which charging of the deteriorated cell is started as described above with reference to FIG. 12. Accordingly, the area which cannot be measured at the first time and shown in (a) of FIG. 12 can be measured at the second time shown in (b) of FIG. 12 by causing the balance circuit 23 to shift the position of the capacity Q at which charging of the deteriorated cell is started, thereby acquiring the differential characteristics including the singular points of a selected cell having a larger maximum capacity than that of the deteriorated cell and the maximum capacity $Q_{max}$.

As described above, the secondary battery capacity measuring system according to this embodiment measures the capacity Q and the inter-terminal voltage value V of each of a plurality selected cells including the deteriorated cell, generates the first measured differential characteristic curve and the second measured differential characteristic curve, performs the process of fitting the first reference differential curve and the second reference differential curve, calculates the coefficients k1, k2, k3, and k4 of the separated-wave differential curves $(f(V))_{Peak1}$, $(f(V))_{Peak2}$, $(f(V))_{Peak3}$, and $(f(V))_{Peak4}$ constituting the first reference differential curve, calculates the coefficient P indicating a degree of cell deterioration in a non-selected cell to be estimated using the coefficients k1, k2, k3, and k4, multiplies the coefficient by the initial maximum capacity $Q_{ini}$ of the deteriorated cell, and estimates the maximum capacity $Q_{max}$ of the non-selected cell to be estimated.

Accordingly, in the secondary battery capacity measuring system according to this embodiment, the maximum capacity $Q_{max}$ of the non-selected cell which cannot be actually measured because the charging process on the plurality of selected cells is ended in the middle way can be easily estimated using the initial maximum capacity $Q_{ini}$ calculated from the measured values of the selected cells and the coefficients k1, k2, k3, and k4 of the separated-wave differential curves $(f(V))_{Peak1}$, $(f(V))_{Peak2}$, $(f(V))_{Peak3}$, and $(f(V))_{Peak4}$ constituting the first reference differential curve corresponding to each selected cell, in comparison with the first embodiment.

In an actual operating environment of an actual stationary electricity storage system, the room temperature may be controlled by an air conditioner, but there may be a passive environment in which the system is exposed to outside air and the temperature greatly varies. Even when the room temperature is controlled in a constant temperature, the temperature of the battery may vary due to internal heat emission in charging and discharging of the battery.

In general, it is known that differential characteristics of a curve indicating a correspondence between a capacity Q and a voltage value V of a battery vary depending on a temperature. This is because a degree of ease with which an insertion reaction or an elimination reaction of ions with respect to the active materials in the positive electrode and the negative electrode of a battery varies depending on the temperature or mobility of ions between the electrodes varies due to the variation of viscosity of an electrolyte in the battery depending on the temperature. Even in a plurality of materials having a phase transition phenomenon such as graphite, which is used for a battery, there are parts in which sensitivity of battery characteristics to the phase transition phenomenon depending on the temperature is great and small.

Accordingly, in the first embodiment and the second embodiment, the coefficients k1, k2, k3, and k4 of the separated-wave differential curves $(f(V))_{Peak1}$, $(f(V))_{Peak2}$, $(f(V))_{Peak3}$, and $(f(V))_{Peak4}$ may be calculated for each ambient temperature.

That is, the fitting processing unit 15 may measure the ambient temperature of the battery module 2 (f the battery module 2A) using a temperature sensor which is not shown, and may write and store the coefficients k1, k2, k3, and k4 to and in a temperature-correlated coefficient table for each acquired temperature of the measured data used for the fitting.

FIG. 14 is a diagram showing an example of a configuration of a temperature-correlated coefficient table indicating a correspondence between the temperature and the coefficients k1, k2, k3, and k4. In FIG. 14, the coefficients k1, k2, k3, and k4 are shown in correlation with the temperatures. For example, numerical values of the coefficients k1, k2, k3, and k4 in a temperature range of 5° C. to 14.9° C. are described when the temperature is described to be 5° C., and numerical values of the coefficients k1, k2, k3, and k4 in a temperature range of 15° C. to 24.9° C. are described when the temperature is described to be 15° C., . . . , and numerical values of the coefficients k1, k2, k3, and k4 in a temperature range of 45° C. to 54.9° C. are described when the temperature is described to be 45° C.

The maximum capacity calculating unit 16 may measure the temperature of the battery module 2 using a temperature sensor (not shown) for measuring the temperature of the battery module 2 (or the battery module 2A), read the coefficients k1, k2, k3, and k4 corresponding to the measured temperature from the temperature-correlated coefficient table, and estimate the maximum capacity of a non-selected cell.

Accordingly, according to the first embodiment and the second embodiment, it is possible to estimate the maximum capacities of non-selected cells depending on an ambient temperature environment of the battery module.

In the first embodiment and the second embodiment, measurement of the current value I and the inter-terminal voltage value V for updating the coefficients k1, k2, k3, and k4 may be performed when the battery module (the secondary battery) 2 or 2A is actually used or may be performed in a state in which a predetermined period is provided as a charging coefficient update mode, or both or one of the measurement methods may be used.

Moreover, in the first embodiment and the second embodiment which were mentioned above, the function expressing the differentiation characteristic curve is a curve based on composition of two or more peak functions originating in electrode material characteristics, and the maximum capacity presumption is possible by fitting by changing independently the separate coefficients k1, k2, k3, and k4 corresponding to the change ratio of each peak intensity.

Moreover, in the first embodiment and the second embodiment which were mentioned above, when the maximum capacity operation part judges with one or more cells containing all details existing so that fully for calculating the coefficients k1, k2, k3, and k4 corresponding to the change ratio of the peak intensity of each above among two or more cells which constitute a group battery, each of the coefficients k1, k2, k3, and k4 may be acquired by fitting with the function expressing the differentiation characteristic curve surveyed and the above-mentioned differentiation characteristic curve of the cell concerned.

Moreover, in the first embodiment and the second embodiment which were mentioned above, the maximum capacity operation part introduces each coefficient k1, k2, k3, and k4 corresponding to the change ratio of the peak intensity of each above as a constant of the above-mentioned function, the maximum capacity of all the cells which constitute a group battery may be presumed by fitting with the function expressing the differentiation characteristic curve surveyed and the differentiation characteristic curve using the variable P showing the ratio of the present maximum capacity $Q_{max}$ to the maximum capacity $Q_{ini}$ of an initial battery.

Moreover, in the first embodiment and the second embodiment which were mentioned above, the maximum capacity operation part as each coefficient k1, k2, k3, and k4 corresponding to the change ratio of the peak intensity of each above, the combination of a different coefficient at a given temperature of a cell may be acquired and stored, respectively, and the combination of a coefficient may be chosen each time according to the survey temperature of the cell at the time of presumption, and the maximum capacity may be presumed.

Moreover, in the first embodiment and the second embodiment which were mentioned above, the maximum capacity operation part may change a fitting domain of study arbitrarily by the SOC balance regulating function by a cell balance circuit.

The process of estimating maximum capacities of cells of a battery module may be realized by recording a program for embodying the functions of the units of the secondary battery capacity measuring system according to the present invention on a computer-readable recording medium and causing a computer system to read and execute the program recorded on the recording medium. The "computer system" mentioned herein includes an operating system (OS) or hardware such as peripherals. The "computer system" includes a WWW system having a homepage providing environment (or a homepage display environment). Examples of the "computer-readable recording medium" include a portable medium such as a flexible disk, a magneto-optical disk, a ROM, or a CD-ROM and a storage device such as a hard disk built in the computer system. The "computer-readable recording medium" may include a medium that holds a program for a predetermined time like a volatile memory (RAM) in a computer system serving as a server or a client when a program is transmitted via a network such as the Internet or a communication line such as a telephone circuit.

The program may be transmitted from a computer system storing the program in a storage device or the like to another computer system via a transmission medium or carrier waves in the transmission medium. Here, the "transmission medium" for transmitting the program means a medium having a function of transmitting information like a network (a communication network) such as the Internet or a communication circuit (a communication line) such as a telephone circuit. The program may serve to realize a part of the above-mentioned functions. The program may be a so-called differential file (differential program) which realize the above-mentioned functions in combination with another program stored in the computer system.

As used herein, the following directional terms "forward, rearward, above, downward, right, left, vertical, horizontal, below, transverse, row and column" as well as any other similar directional terms refer to those directions of a device equipped with the present invention. Accordingly, these terms, as utilized to describe the present invention should be interpreted relative to a device equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percent of the modified term if this deviation would not negate the meaning of the word it modifies.

The term "configured" is used to describe a component, unit or part of a device includes hardware and/or software that is constructed and/or programmed to perform the desired function.

Moreover, terms that are expressed as "means-plus function" in the claims should include any structure that can be utilized to perform the function of that part of the present invention.

The term "unit" or "part" is used to describe a component, unit or part of a hardware and/or software that is constructed and/or programmed to perform the desired function. Typical examples of the hardware may include, but are not limited to, a device and a circuit.

While preferred embodiments of the invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

What is claimed is:

1. A secondary battery capacity measuring system comprising:
a processor;
a memory;
a current sensor; and
a voltage sensor,
wherein the processor executes a program stored in the memory to perform operations comprising:
calculating a differential characteristic curve indicating differential characteristics with parameters of capacity and voltage value in predetermined voltage ranges from history data of measured values obtained by causing the voltage sensor and the current sensor to acquire the voltage value and a current value of the battery configured by a plurality of cells in time series for each cell;
comparing a reference differential curve, which indicates differential characteristics with parameters of capacity and voltage value of a cell, includes a plurality of separated-wave differential curves multiplied by first coefficients, and is multiplied by a second coefficient indicating a deterioration ratio from an initial maximum capacity that is initially measured, with a differential characteristic curve indicating differential characteristics with parameters of measured capacity and measured voltage value of one cell selected from the plurality of cells, and calculating first coefficients of the separated-wave differential curves;
fitting the reference differential curve using the first coefficients to a partial differential characteristic curve in a measured voltage range of a non-selected cell other than the selected cell among the plurality of cells, calculating the second coefficient, multiplying the initial maximum capacity by the second coefficient, and setting the multiplication result as an estimation result of the maximum capacity of the non-selected cell, and
controlling at least one of charging and discharging of the battery on the basis of the estimation result of the maximum capacity of the non-selected cell,
wherein the separated-wave differential curves include a differential characteristic curve based on material characteristics of a positive electrode and a differential characteristic curve based on material characteristics of a negative electrode.

2. The secondary battery capacity measuring system according to claim 1, wherein the processor is further configured to map a correspondence between third coefficients of the separated-wave differential curves acquired from the fitting result and the second coefficient of the selected cell on a graph, and set slopes of regression lines formed by the third coefficients of the separated-wave differential curves and the second coefficient as corrected values of the first coefficients.

3. The secondary battery capacity measuring system according to claim 1, wherein the differential characteristic curve, the partial differential characteristic curve, and the reference differential curve include:
a differential curve indicating a first correspondence between the voltage value in the battery and a numerical value acquired by differentiating the capacity using a voltage variation as a differential operator; and
a differential curve indicating a second correspondence between the capacity in the battery and a numerical value acquired by differentiating the voltage value using a capacity variation as a differential operator.

4. The secondary battery capacity measuring system according to claim 1, wherein the differential characteristic curve is generated from measured values in a range including feature points derived from a separated-wave differential curve which is used to perform fitting for calculating the first coefficients of the separated-wave differential curves.

5. The secondary battery capacity measuring system according to claim 1, wherein the processor is further configured to calculate the first coefficients to correspond to an ambient temperature of the secondary battery and writes and stores the first coefficients to and in a table indicating a correspondence between the temperature and the first coefficients, and
read the first coefficients corresponding to the ambient temperature of the secondary battery from the table and performs an operation of estimating the maximum capacity of the non-selected cell when estimating the maximum capacity of the non-selected cell.

6. The secondary battery capacity measuring system according to claim 1, wherein a deteriorated cell having a smallest maximum capacity is selected and used as the selected cell from the plurality of cells of the secondary battery.

7. The secondary battery capacity measuring system according to claim 1, wherein a plurality of cells including a deteriorated cell having a smallest maximum capacity are selected and used as the selected cell from the plurality of cells of the secondary battery.

8. The secondary battery capacity measuring system according to claim 7, further comprising a balance circuit configured to shift a capacity position at which charging of the deteriorated cell is started so as to measure the capacity and the voltage value of the selected cell within a range including feature points similar to the deteriorated cell.

9. A secondary battery capacity measuring method of measuring a maximum capacity of a secondary battery including a plurality of cells, the secondary battery capacity measuring method being executed by a secondary battery capacity measuring system comprising a processor, a memory, a current sensor, and a voltage sensor, the secondary battery capacity measuring method causing the processor to execute a program stored in a memory to perform operations comprising:
calculating a differential characteristic curve indicating differential characteristics with parameters of capacity and voltage value of a battery in predetermined voltage ranges as parameters from history data of measured values obtained by causing the voltage sensor and the current sensor to acquire the voltage value and a current value of the battery in time series for each cell;
comparing a reference differential curve, which indicates differential characteristics with parameters of the capacity and the voltage value of a cell, includes a plurality of separated-wave differential curves multiplied by first coefficients, and is multiplied by a second coefficient indicating a deterioration ratio from an initial maximum capacity that is initially measured, with a differential characteristic curve indicating differential characteristics with parameters of the measured capacity and the measured voltage value of one cell selected from the plurality of cells, to calculating the first coefficients of the separated-wave differential curves;
fitting the reference differential curve using the first coefficients to a partial differential characteristic curve in a measured voltage range of a non-selected cell other than the selected cell among the plurality of cells, calculating the second coefficient, multiplying the initial maximum capacity by the second coefficient, and setting the multiplication result as an estimation result of the maximum capacity of the non-selected cell, and controlling at least one of charging and discharging of the battery on the basis of the estimation result of the maximum capacity of the non-selected cell, wherein the separated-wave differential curves include a differential characteristic curve based on material characteristics of a positive electrode and a differential characteristic curve based on material characteristics of a negative electrode.

10. The secondary battery capacity measuring method according to claim 9, wherein the processor is further configured to map a correspondence between third coefficients of the separated-wave differential curves acquired from the fitting result and the second coefficient of the selected cell on a graph, and set slopes of regression lines formed by the third coefficients of the separated-wave differential curves and the second coefficient as corrected values of the first coefficients.

11. The secondary battery capacity measuring method according to claim 9, wherein the differential characteristic curve, the partial differential characteristic curve, and the reference differential curve include:

a differential curve indicating a first correspondence between the voltage value in the battery and a numerical value acquired by differentiating the capacity using a voltage variation as a differential operator; and a differential curve indicating a second correspondence between the capacity in the battery and a numerical value acquired by differentiating the voltage value using a capacity variation as a differential operator.

12. The secondary battery capacity measuring method according to claim 9, wherein the differential characteristic curve is generated from measured values in a range including feature points derived from a separated-wave differential curve which is used to perform fitting for calculating the first coefficients of the separated-wave differential curves.

13. The secondary battery capacity measuring method according to claim 9, wherein the processor is further configured to calculate the first coefficients to correspond to an ambient temperature of the secondary battery and write and store the first coefficients to and in a table indicating a correspondence between the temperature and the first coefficients, and read the first coefficients corresponding to the ambient temperature of the secondary battery from the table and perform an operation of estimating the maximum capacity of the non-selected cell when estimating the maximum capacity of the non-selected cell.

14. The secondary battery capacity measuring method according to claim 9, wherein a deteriorated cell having a smallest maximum capacity is selected and used as the selected cell from the plurality of cells of the secondary battery.

15. The secondary battery capacity measuring method according to claim 9, wherein a plurality of cells including a deteriorated cell having a smallest maximum capacity are selected and used as the selected cell from the plurality of cells of the secondary battery.

* * * * *